(12) United States Patent
Kimura et al.

(10) Patent No.: US 10,866,682 B2
(45) Date of Patent: Dec. 15, 2020

(54) INPUT/OUTPUT PANEL, SEMICONDUCTOR DEVICE, AND DRIVING METHOD

(71) Applicant: Semiconductor Energy Laboratory Co., Ltd., Atsugi (JP)

(72) Inventors: Hajime Kimura, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/443,437

(22) Filed: Jun. 17, 2019

(65) Prior Publication Data

US 2019/0310729 A1 Oct. 10, 2019

Related U.S. Application Data

(62) Division of application No. 15/725,527, filed on Oct. 5, 2017, now Pat. No. 10,345,977.

(30) Foreign Application Priority Data

Oct. 14, 2016 (JP) ................. 2016-202528

(51) Int. Cl.
*G06F 3/044* (2006.01)
*G06F 3/047* (2006.01)
(Continued)

(52) U.S. Cl.
CPC .......... *G06F 3/044* (2013.01); *G02F 1/13338* (2013.01); *G02F 1/134309* (2013.01); *G02F 1/136286* (2013.01); *G06F 3/047* (2013.01); *G06F 3/0412* (2013.01); *H01L 27/124* (2013.01); *H01L 27/1255* (2013.01);
(Continued)

(58) Field of Classification Search
CPC ....................................................... G06F 3/044
See application file for complete search history.

(56) References Cited

U.S. PATENT DOCUMENTS 7,859,521 B2 12/2010 Hotelling et al.
7,920,129 B2 4/2011 Hotelling et al.
(Continued)

FOREIGN PATENT DOCUMENTS

JP 2009-244958 A 10/2009
JP 2011-197685 A 10/2011

*Primary Examiner* — Chad M Dicke
(74) *Attorney, Agent, or Firm* — Robinson Intellectual Property Law Office; Eric J. Robinson

(57) ABSTRACT

A novel input/output panel that is highly convenient and reliable is provided. The input/output panel includes a gate wiring, a first electrode, a second electrode, a current sensing circuit, and a pixel. The first electrode is electrically connected to the gate wiring. The second electrode intersects with the gate wiring and is provided so that capacitance is generated between the first electrode and the second electrode. The current sensing circuit is electrically connected to the second electrode and has a function of sensing a change in the capacitance. The pixel includes a transistor and a display element. The transistor includes a gate electrode, a source electrode, and a drain electrode. The gate electrode is electrically connected to the gate wiring. The display element includes a third electrode and a liquid crystal material. The third electrode is electrically connected to the source electrode or the drain electrode.

9 Claims, 27 Drawing Sheets

(51) Int. Cl.
  *G06F 3/041* (2006.01)
  *G02F 1/1362* (2006.01)
  *H01L 27/12* (2006.01)
  *G02F 1/1333* (2006.01)
  *G02F 1/1343* (2006.01)
  *H01L 27/32* (2006.01)
  *G02F 1/1368* (2006.01)
  *H01L 51/52* (2006.01)

(52) U.S. Cl.
  CPC ...... *G02F 1/1368* (2013.01); *G02F 1/134363* (2013.01); *G02F 1/136227* (2013.01); *G02F 2001/134372* (2013.01); *G02F 2201/121* (2013.01); *G02F 2201/123* (2013.01); *G02F 2201/128* (2013.01); *G06F 2203/04102* (2013.01); *G06F 2203/04103* (2013.01); *H01L 27/1259* (2013.01); *H01L 27/323* (2013.01); *H01L 27/3262* (2013.01); *H01L 27/3276* (2013.01); *H01L 51/5225* (2013.01); *H01L 2227/323* (2013.01); *H01L 2251/5315* (2013.01)

(56) References Cited

U.S. PATENT DOCUMENTS

| | | | |
|---|---|---|---|
| 7,995,041 B2 | 8/2011 | Chang | |
| 8,217,913 B2 | 7/2012 | Hotelling et al. | |
| 8,363,027 B2 | 1/2013 | Hotelling et al. | |
| 8,502,799 B2 | 8/2013 | Hotelling et al. | |
| 8,786,557 B2 | 7/2014 | Noguchi et al. | |
| 9,134,560 B2 | 9/2015 | Hotelling et al. | |
| 9,335,875 B2 | 5/2016 | Noguchi et al. | |
| 9,535,277 B2 | 1/2017 | Yamazaki et al. | |
| 9,542,047 B2 | 1/2017 | Noguchi et al. | |
| 9,760,200 B2 | 9/2017 | Hotelling et al. | |
| 9,780,121 B2 | 10/2017 | Watanabe et al. | |
| 2002/0176030 A1 | 11/2002 | Matsumoto | |
| 2007/0154629 A1 | 7/2007 | Fujita | |
| 2009/0135158 A1 | 5/2009 | Takahashi et al. | |
| 2009/0256818 A1 | 10/2009 | Noguchi et al. | |
| 2013/0265244 A1* | 10/2013 | Kim | G06F 3/044 345/173 |
| 2014/0267349 A1* | 9/2014 | Lee | G06F 3/044 345/589 |
| 2015/0301422 A1 | 10/2015 | Miyake et al. | |
| 2015/0311260 A1 | 10/2015 | Senda et al. | |
| 2016/0054616 A1 | 2/2016 | Makiuchi et al. | |
| 2016/0147339 A1 | 5/2016 | Teranishi et al. | |
| 2016/0282990 A1 | 9/2016 | Kimura et al. | |
| 2016/0299601 A1 | 10/2016 | Yamazaki et al. | |
| 2016/0321987 A1 | 11/2016 | Oh | |
| 2016/0342255 A1 | 11/2016 | Noguchi et al. | |
| 2017/0262107 A1 | 9/2017 | Kimura et al. | |

* cited by examiner

INPUT/OUTPUT PANEL, SEMICONDUCTOR DEVICE, AND DRIVING METHOD

BACKGROUND OF THE INVENTION

1. Field of the Invention

One embodiment of the present invention relates to an input/output panel, a semiconductor device, and a driving method.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A structure in which a common electrode that is for display and originally arranged for each liquid crystal display element is used as one electrode (a drive electrode) of a pair of touch sensor electrodes, and the other electrode (a detection electrode for a sensor) is newly formed, has been known. In addition, a structure in which a common driving signal existing as a driving signal for display is also used as a driving signal for a touch sensor is known (Patent Document 1).

Touch sensing circuits in which circuit elements, such as touch signal lines (e.g., drive lines and sense lines) and grounding regions, in display pixel stackups are grouped together, and which sense a touch on or near the display are known (Patent Document 2).

REFERENCE

[Patent Document]
[Patent Document 1] Japanese Published Patent Application No. 2009-244958
[Patent Document 2] Japanese Published Patent Application No. 2011-197685

SUMMARY OF THE INVENTION

An object of one embodiment of the present invention is to provide a novel input/output panel that is highly convenient or reliable. Another object is to provide a novel input/output panel or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) An input/output panel of one embodiment of the present invention includes a gate wiring, a first electrode, a second electrode, a current sensing circuit, and a pixel. The first electrode is electrically connected to the gate wiring. The second electrode intersects with the gate wiring and is provided so that capacitance is generated between the first electrode and the second electrode. The current sensing circuit is electrically connected to the second electrode and has a function of sensing a change in the capacitance. The pixel includes a transistor and a display element. The transistor includes a gate electrode, a source electrode, and a drain electrode. The gate electrode is electrically connected to the gate wiring. The display element includes a third electrode and a liquid crystal material. The third electrode is electrically connected to the source electrode or the drain electrode.

(2) In the above embodiment, the third electrode is preferably provided so that an electric field controlling alignment of the liquid crystal material is generated between the second electrode and the third electrode.

(3) In each of the above embodiments, the third electrode preferably includes a region positioned between the liquid crystal material and the second electrode.

(4) In each of the above embodiments, the display element preferably includes a fourth electrode, the third electrode is preferably provided so that an electric field controlling the alignment of the liquid crystal material is generated between the third electrode and the fourth electrode, and the fourth electrode is preferably electrically connected to a wiring supplied with a common potential.

(5) In each of the above embodiments, the third electrode preferably includes a region positioned between the liquid crystal material and the fourth electrode.

(6) In each of the above embodiments, the first electrode preferably contains the same material as the third electrode, and the second electrode preferably contains the same material as the fourth electrode.

(7) In each of the above embodiments, a backlight is preferably provided, one or both of the second electrode and the third electrode preferably have reflectance greater than or equal to 5% and less than 100% and light transmittance greater than or equal to 1% and less than 95% with respect to light with a wavelength in a range greater than or equal to 400 nm and less than 800 nm, and the backlight preferably has a function of emitting light through the layer containing a liquid crystal material.

(8) In each of the above embodiments, a backlight is preferably provided, one or both of the third electrode and the fourth electrode preferably have reflectance greater than or equal to 5% and less than 100% and light transmittance greater than or equal to 1% and less than 95% with respect to light with a wavelength in a range greater than or equal to 400 nm and less than 800 nm, and the backlight preferably has a function of emitting light through the layer containing a liquid crystal material.

(9) An input/output panel of one embodiment of the present invention includes a gate wiring, a first electrode, a second electrode, a current sensing circuit, and a pixel. The first electrode is electrically connected to the gate wiring. The second electrode intersects with the gate wiring and is provided so that capacitance is generated between the first electrode and the second electrode. The current sensing circuit is electrically connected to the second electrode and has a function of sensing a change in the capacitance. The pixel includes a first transistor, a second transistor, and a light-emitting element. The first transistor includes a first gate electrode, a first source electrode, and a first drain electrode. The second transistor includes a second gate electrode, a second source electrode, and a second drain electrode. The first gate electrode is electrically connected to the gate wiring. The first source electrode or the first drain electrode is electrically connected to the second gate electrode. The second source electrode or the second drain electrode has a function of supplying electric power for driving the light-emitting element.

(10) A semiconductor device of one embodiment of the present invention includes one or more of a keyboard, a hardware button, a pointing device, a touch sensor, an illuminance sensor, an imaging device, an audio input device, a sight input device, and a posture determination device, and the above-described input/output panel.

(11) One embodiment of the present invention is a method for driving an input/output panel including a gate wiring, a signal line, and a pixel electrically connected to the gate wiring and the signal line. The method includes the step of supplying a video signal to the signal line and sensing proximity of an object to the gate wiring in a period in which a selection signal is supplied to the gate wiring.

(12) One embodiment of the present invention is a method for driving an input/output panel including gate wirings, a signal line, and a pixel. The pixel is electrically connected to the gate wiring and the signal line and includes a display element. The method includes first to third periods. In the first period, predetermined voltage is supplied to the signal line. In the second period, a selection signal is supplied to the gate wirings in a predetermined order so that all the gate wirings are supplied with the selection signal, and proximity of an object to the gate wirings is sensed. In the third period, a selection signal is supplied to the gate wirings in a predetermined order so that all the gate wirings are supplied with the selection signal, and a video signal is supplied to the signal line.

(13) One embodiment of the present invention is a method for driving an input/output panel including gate wirings, a signal line, and a pixel. The pixel is electrically connected to the gate wiring and the signal line and includes a display element. The method includes first to third periods. In the first period, predetermined voltage is supplied to the signal line. In the second period, a selection signal is supplied to groups of adjacent gate wirings in a predetermined order group by group so that all the gate wirings are supplied with the selection signal, and proximity of an object to the groups of adjacent gate wirings is sensed. In the third period, a selection signal is supplied to the gate wirings in a predetermined order so that all the gate wirings are supplied with the selection signal, and a video signal is supplied to the signal line.

(14) One embodiment of the present invention is a method for driving an input/output panel including a first display region and a second display region. The first display region is adjacent to the second display region. The first display region includes a group of gate wirings and a signal line. The second display region includes another group of gate wirings and a signal line. The method includes first to sixth periods. In the first period, predetermined voltage is supplied to the signal line. In the second period, a selection signal is supplied to the group of gate wirings and proximity of an object to the group of gate wirings is sensed. In the third period, a selection signal is supplied to the group of gate wirings in a predetermined order one by one so that the group of gate wirings is supplied with the selection signal, and a video signal is supplied to the signal line. In the fourth period, predetermined voltage is supplied to the signal line. In the fifth period, a selection signal is supplied to the other group of gate wirings and proximity of an object to the other group of gate wirings is sensed. In the sixth period, a selection signal is supplied to the other group of gate wirings in a predetermined order one by one so that the other group of gate wirings is supplied with the selection signal, and a video signal is supplied to the signal line.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

Note that in this specification, a "source" of a transistor means a source region that is part of a semiconductor film or a source electrode connected to the semiconductor film. Similarly, a "drain" of a transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor so that current, a potential, or voltage can be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Furthermore, in this specification, one of a first electrode and a second electrode of a transistor refers to a source electrode and the other refers to a drain electrode.

According to one embodiment of the present invention, a novel input/output panel that is highly convenient or reliable can be provided. According to another embodiment of the present invention, a novel input/output panel or a novel semiconductor device can be provided.

Note that the descriptions of these effects do not disturb the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
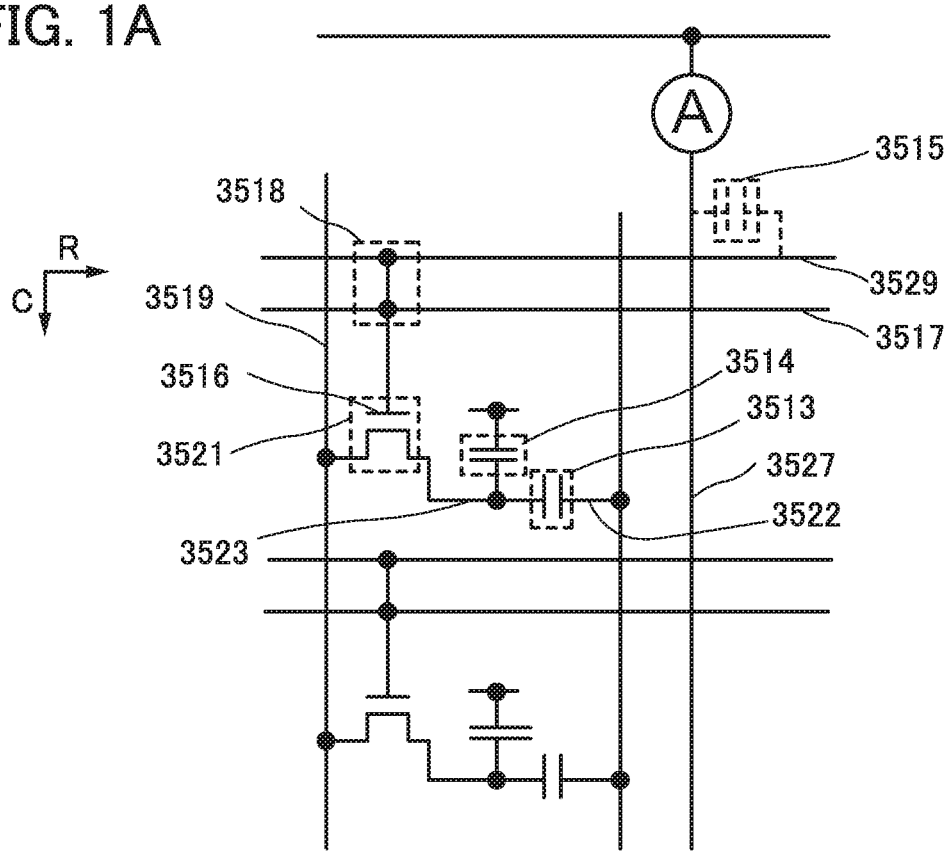
FIGS. 1A and 1B are circuit diagrams each illustrating a structure of an input/output panel of an embodiment.

Embodiments will be described in detail with reference to the drawings. Note that the present invention is not limited to the following description, and it will be readily appreciated by those skilled in the art that modes and details can be modified in various ways without departing from the spirit and the scope of the present invention. Thus, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. Note that CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

Embodiments will be described in detail with reference to the drawings. Note that the present invention is not limited to the following description, and it will be readily appreciated by those skilled in the art that modes and details can be modified in various ways without departing from the spirit and the scope of the present invention. Thus, the present invention should not be construed as being limited to the description in the following embodiments. Note that in structures of the invention described below, the same portions or portions having similar functions are denoted by the same reference numerals in different drawings, and a description of such portions is not repeated.

Embodiment 1

In this embodiment, a structure example of a sensor that can sense proximity or touch of an object (hereinafter, the sensor is also referred to as a touch sensor) and can be used in an input/output panel of one embodiment of the present invention will be described. The input/output panel of one embodiment of the present invention includes a display element.

A capacitive touch sensor is used as the touch sensor of one embodiment of the present invention. Examples of the capacitive touch sensor are typically of a surface capacitive type and a projected capacitive type. Examples of the projected capacitive type are of a self capacitive type and a mutual capacitive type mainly in accordance with the difference in the driving method. Here, the use of a mutual capacitive type is preferable because of simultaneous sensing of multiple points (also referred to as multipoint sensing or multi-touch).

The input/output panel of one embodiment of the present invention includes a capacitive sensor. The capacitive sensor includes a pair of electrodes. Capacitance is generated between the pair of electrodes. One of the pair of electrodes is a sensor electrode connected to a gate wiring. The gate wiring has a function of supplying a selection signal.

The other of the pair of electrodes intersects with the gate wiring.

In one embodiment of the present invention, the other of the pair of electrodes is separated from an electrode of a display element. This structure is described with reference to FIG. 1A. In another embodiment of the present invention, the other of the pair of electrodes also serves as the electrode of the display element. This structure is described with reference to FIG. 1B.

Figure 1B:
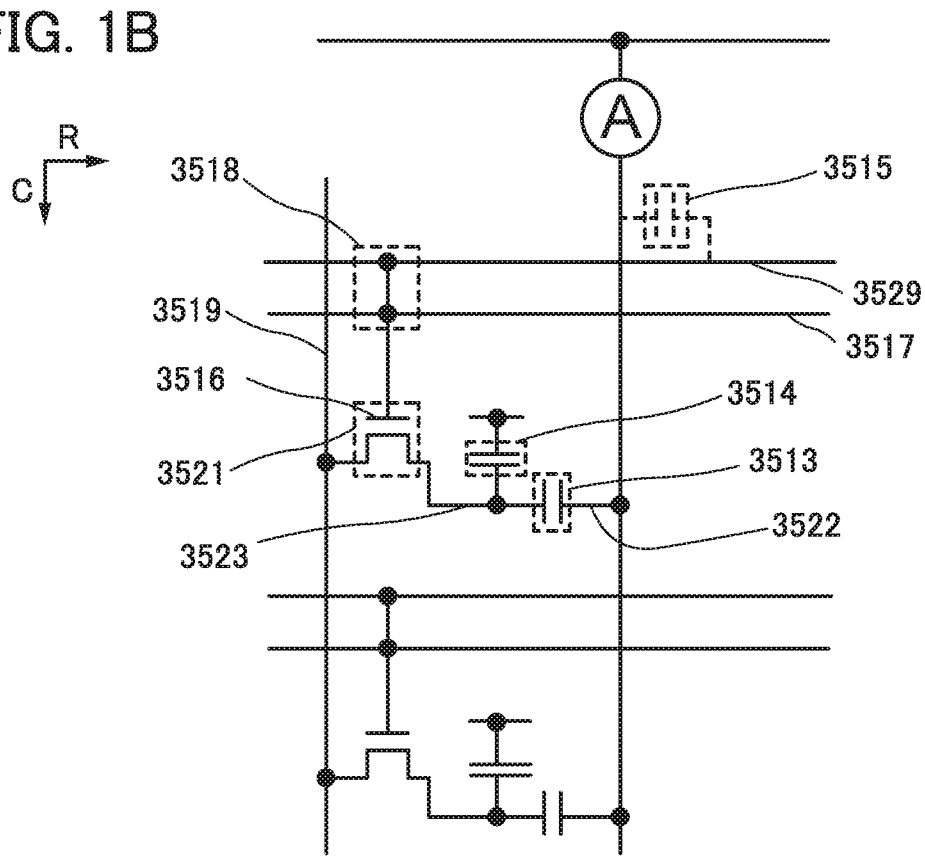

FIGS. 1A and 1B are each a circuit diagram of a pixel portion in the input/output panel of one embodiment of the present invention. The input/output panel of one embodiment of the present invention includes the display element that includes a layer containing a liquid crystal material. The input/output panel of one embodiment of the present invention also includes the pixel portion. The pixel portion includes a liquid crystal element 3513, a capacitor portion 3514, a capacitive sensor portion 3515, a gate electrode 3516, a gate wiring 3517, a contact region 3518, a source wiring 3519, a transistor 3521, and a sensor electrode 3529. The pixel portion also includes a common electrode 3522 and a pixel electrode 3523. The common electrode 3522 is supplied with a common potential for driving the liquid crystal element 3513. The pixel electrode 3523 is electrically connected to the transistor 3521. The transistor 3521 can supply a signal from the source wiring 3519 to the pixel electrode 3523 in response to the selection signal. Note that the transistor 3521 is also referred to as a selection transistor. The source wiring 3519 is also simply referred to as a signal line.

In the contact region 3518, the sensor electrode 3529 is electrically connected to the gate wiring 3517. Furthermore, the gate electrode 3516 is electrically connected to the gate wiring 3517. That is, the gate wiring 3517 functions as an auxiliary wiring of the sensor electrode 3529 and a wiring that supplies the selection signal for driving the transistor 3521.

The common electrode 3522 includes a region that is parallel to the source wiring 3519. Note that in FIGS. 1A and 1B, a direction indicated by an arrow R is a row direction and a direction indicated by an arrow C is a column direction.

The liquid crystal element 3513 includes the common electrode 3522 and the pixel electrode 3523. An electric field in the layer containing a liquid crystal material can be changed using the common electrode 3522 and the pixel electrode 3523.

The pixel portion includes the capacitor portion 3514. The capacitor portion 3514 can accumulate electric charge. Accordingly, voltage needed for display by the liquid crystal element 3513 can be maintained for a period from the selection of the gate wiring 3517 to the next selection of the gate wiring 3517 (this period is also referred to as one frame period). Specifically, voltage between the common electrode 3522 and the pixel electrode 3523 can be maintained. One of two electrodes of the capacitor portion 3514 that is not electrically connected to the pixel electrode 3523 is supplied with a common potential. Note that the capacitor portion 3514 is not illustrated in some drawings.

The input/output panel described with reference to the circuit diagram in FIG. 1A includes a sensor electrode 3527. The sensor electrode 3527 is separated from the common electrode 3522.

The capacitive sensor portion 3515 includes the sensor electrode 3529 and the sensor electrode 3527. The touch sensor of one embodiment of the present invention can sense a change in capacitance between the sensor electrode 3529 and the sensor electrode 3527 when a finger, a stylus pen, or the like approaches the touch sensor. The sensor electrode 3527 is supplied with a common potential or a floating potential.

The sensor electrode 3527 includes a region that is parallel to the source wiring 3519. The sensor electrode 3527 may be provided with an auxiliary wiring.

The input/output panel described with reference to the circuit diagram in FIG. 1B is different from that described with reference to the circuit diagram in FIG. 1A in that the sensor electrode 3527 is not included. The capacitive sensor portion 3515 includes the sensor electrode 3529 and the common electrode 3522. The touch sensor of one embodiment of the present invention can sense a change in capacitance between the sensor electrode 3529 and the common electrode 3522 when a finger, a stylus pen, or the like approaches the touch sensor.

Figure 2A:
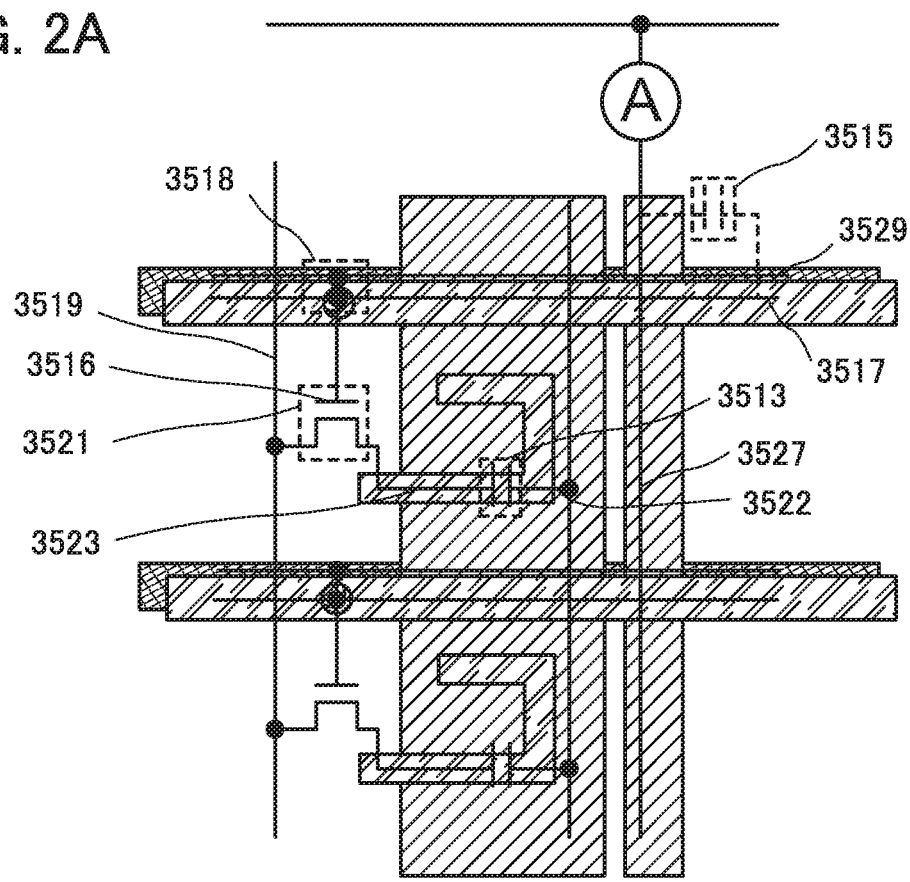
FIGS. 2A and 2B are plan views each illustrating a structure of an input/output panel of an embodiment.
Figure 2B:
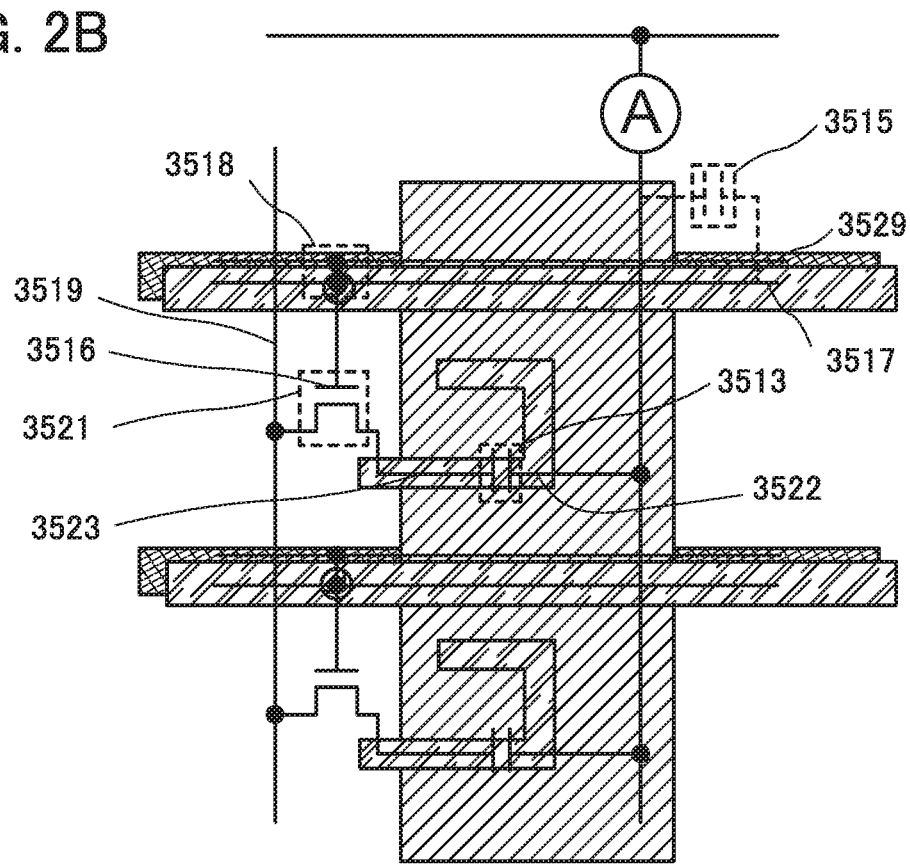

FIG. 2A is a plan view in which structures of wirings and the like are illustrated over the circuit diagram in FIG. 1A. FIG. 2B is a plan view in which structures of wirings and the like are illustrated over the circuit diagram in FIG. 1B. Note that for convenience of description, these plan views do not correspond to the actual sizes or shapes in some cases. In addition, for convenience of description, some wirings and the transistor 3521 are each represented by a symbol. In FIGS. 2A and 2B, the transistor 3521 does not overlap with the common electrode 3522 or the pixel electrode 3523; however, the transistor 3521 may overlap with the common electrode 3522 or the pixel electrode 3523. The transistor 3521 can be positioned in such a way in other plan views.

The input/output panels in FIGS. 2A and 2B each include the gate wiring 3517, the common electrode 3522, the pixel electrode 3523, the sensor electrode 3529, and the contact region 3518. In each of FIGS. 2A and 2B, the capacitor portion 3514 is not illustrated. The input/output panel in FIG. 2A includes the sensor electrode 3527.

The input/output panels in FIGS. 2A and 2B each include a region where the common electrode 3522 is positioned between the gate wiring 3517 and the sensor electrode 3529.

In the input/output panels in FIGS. 2A and 2B, the pixel electrode 3523 and the sensor electrode 3529 contain the same material. Accordingly, the pixel electrode 3523 and the sensor electrode 3529 can be formed through the same process. In the input/output panel in FIG. 2A, the common electrode 3522 and the sensor electrode 3527 contain the same material. Accordingly, the common electrode 3522 and the sensor electrode 3527 can be formed through the same process.

An auxiliary wiring can be provided for the common electrode 3522. This can reduce wiring resistance and decrease the size of a pixel.

The source wiring 3519 may be provided to overlap with an electrode supplied with a common potential or a floating potential. Such a structure can reduce an adverse effect of noise due to the sensor electrode or an object (e.g., a finger). For example, an adverse effect on a video signal, which is supplied from the source wiring 3519, can be reduced.

A method for forming the input/output panel of the present invention is not limited to the above as long as the circuit in FIG. 1A or FIG. 1B is formed. For example, the gate wiring 3517, the sensor electrode 3529, and the common electrode 3522 may be formed in this order from the substrate side. In addition, the pixel electrode 3523 and the sensor electrode 3529 may be formed of different materials. In addition, the common electrode 3522 and the sensor electrode 3527 may be formed of different materials.

Structure Example 1

The input/output panel described with reference to the circuit diagram in FIG. 1A includes the sensor electrode 3527. The sensor electrode 3527 is separated from the common electrode 3522. Part of a structure of a pixel in an input/output panel 3551 is described with reference to a schematic cross-sectional view in FIG. 3A, for example. The input/output panel 3551 includes a layer 3524 containing a liquid crystal material. The input/output panel 3551 includes a liquid crystal element that operates in a fringe field switching (FFS) mode.

Figure 3A:
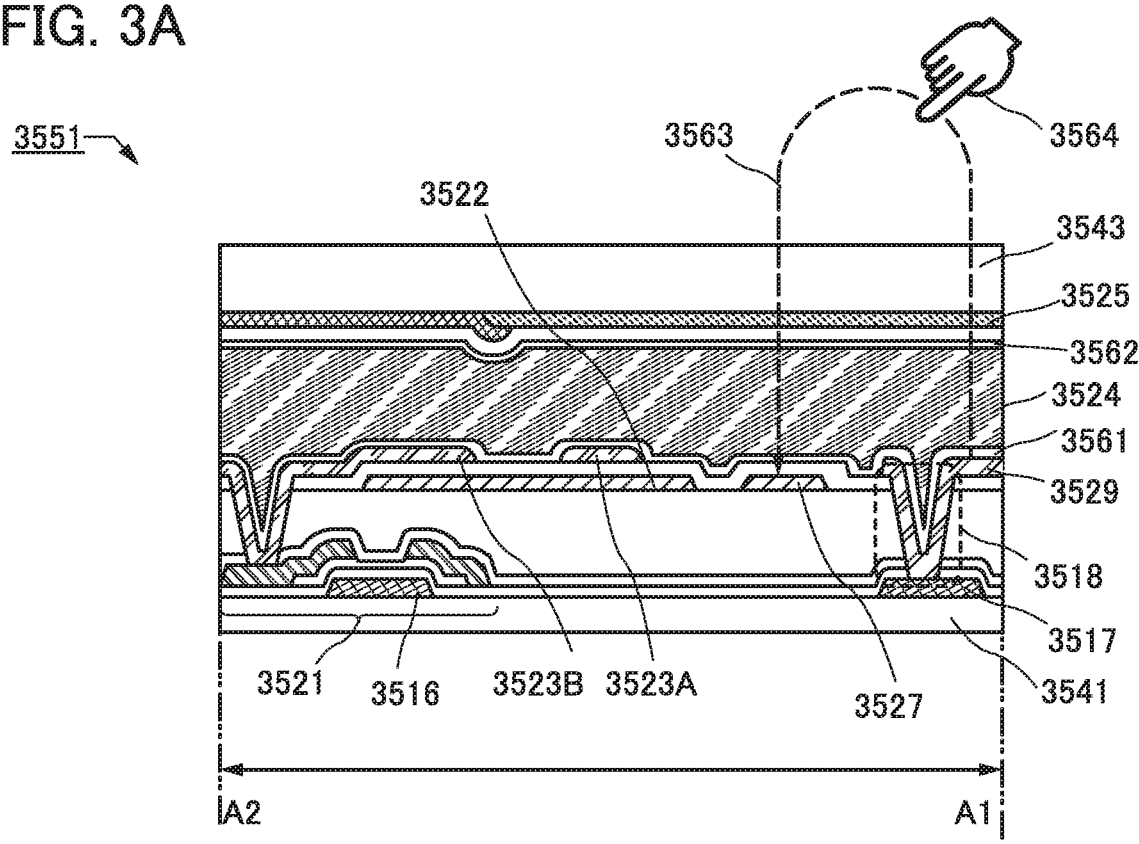
FIGS. 3A and 3B are a cross-sectional view and a plan view illustrating a structure of an input/output panel of an embodiment.

The input/output panel 3551 includes the transistor 3521, the common electrode 3522, the pixel electrode 3523, the layer 3524 containing a liquid crystal material, and a color filter 3525 (see FIG. 3A). The pixel electrode 3523 includes a pixel electrode 3523A and a pixel electrode 3523B. The pixel electrode 3523A and the pixel electrode 3523B are electrically connected to each other. The layer 3524 containing a liquid crystal material is positioned between an alignment film 3561 and an alignment film 3562. The pixel electrodes 3523A and 3523B are electrically connected to one of a source electrode and a drain electrode of the transistor 3521.

The pixel electrodes 3523A and 3523B are parts of the pixel electrode. The pixel electrodes 3523A and 3523B are provided over the common electrode 3522 with an insulating layer positioned between the pixel electrodes and the common electrode. The liquid crystal element includes a pair of electrodes. The pixel electrodes 3523A and 3523B are one of the pair of electrodes, and the common electrode 3522 is the other of the pair of electrodes. The alignment of the liquid crystal material contained in the layer 3524 can be controlled by applying voltage between the pair of electrodes of the liquid crystal element.

The gate wiring 3517 contains the same material as the gate electrode 3516 of the transistor 3521. Accordingly, the gate wiring 3517 and the gate electrode 3516 can be formed through the same process. In addition, the gate wiring 3517 and the gate electrode 3516 can be electrically connected to each other. In addition, the gate wiring 3517 and the sensor electrode 3529 can be electrically connected to each other in the contact region 3518.

The sensor electrode 3527 contains the same material as the common electrode 3522. Accordingly, the sensor electrode 3527 and the common electrode 3522 can be formed through the same process.

The input/output panel 3551 in FIG. 3A includes the sensor electrode 3529 and the sensor electrode 3527. An electric field generated between the sensor electrode 3529 and the sensor electrode 3527 is indicated by a dashed line 3563. FIG. 3A also illustrates a conductive object 3564 across the electric field, for example. Note that the sensor electrode 3529 and the sensor electrode 3527 correspond to the pair of electrodes of the capacitive sensor portion 3515 in the input/output panel described with reference to the circuit diagram in FIG. 1A.

The layer 3524 containing a liquid crystal material is positioned between a substrate 3543 and a substrate 3541.

Figure 3B:
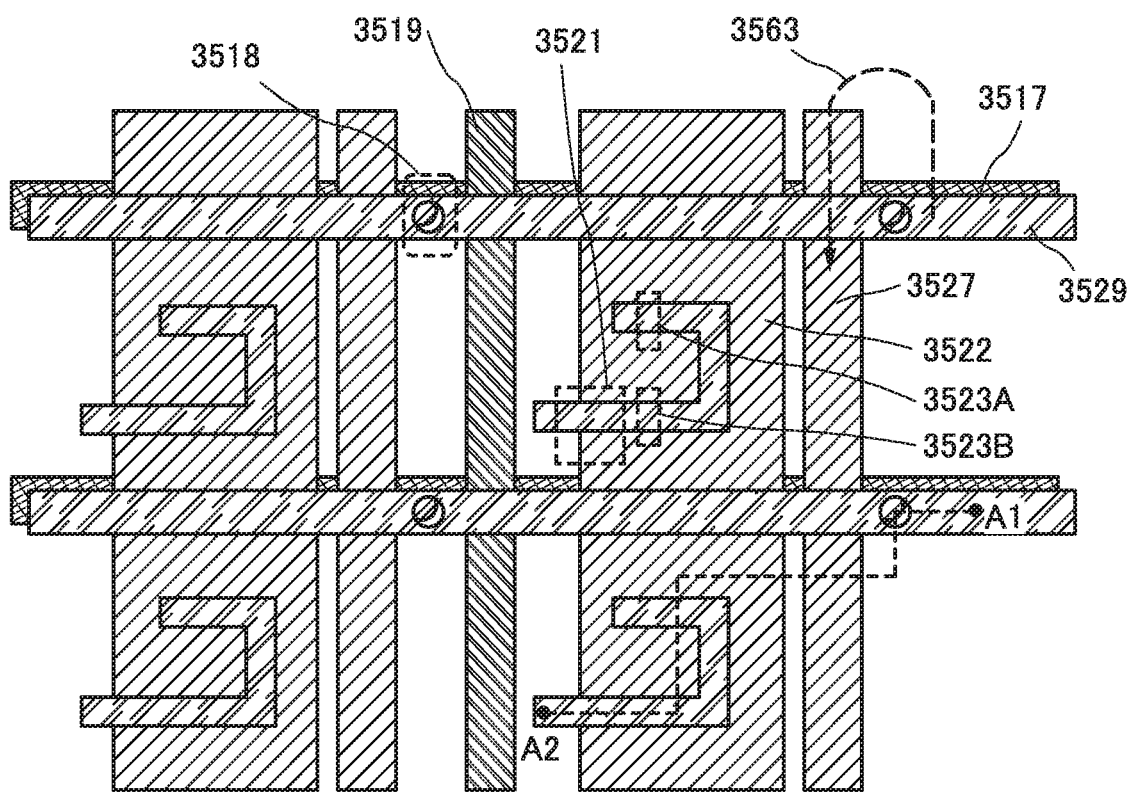

FIG. 3B is a plan view schematically illustrating structures of the wirings and the like of the input/output panel 3551 in FIG. 3A.

In this specification, the line Am-An and the line Bm-Bn in a cross-sectional view correspond to the line Am-An and the line Bm-Bn in a corresponding plan view, respectively. Note that m and n are each a natural number.

The transistor 3521 can be provided to overlap with the common electrode 3522 or the pixel electrode 3523. The gate electrode 3516 of the transistor 3521 is electrically connected to the gate wiring 3517. The source electrode and the drain electrode of the transistor 3521 contain the same material as the source wiring 3519. Accordingly, the source electrode, the drain electrode, and the source wiring 3519 can be formed through the same process. In addition, the source electrode or the drain electrode can be electrically connected to the source wiring 3519. Note that in other plan views, the transistor can be provided to overlap with the common electrode or the pixel electrode.

The transistor 3521 may be a bottom-gate transistor, a top-gate transistor, or a transistor including two gate electrodes, as described in Embodiment 7.

Part of the electric field generated between the sensor electrode 3529 and the sensor electrode 3527 is indicated by the dashed line 3563 (see FIG. 3B). The touch sensor of one embodiment of the present invention can sense the object 3564 that passes across the electric field. Note that the sensor electrode 3529 and the sensor electrode 3527 correspond to the pair of electrodes of the capacitive sensor portion 3515 (see FIG. 1A).

Structure Example 2

The input/output panel described with reference to the circuit diagram in FIG. 1B includes the common electrode 3522 and the sensor electrode 3529. Part of a structure of a pixel in an input/output panel 3552 is described with reference to a schematic cross-sectional view in FIG. 4A, for example. The input/output panel 3552 includes the layer 3524 containing a liquid crystal material. The input/output panel 3552 includes a liquid crystal element that operates in an FFS mode.

Figure 4A:
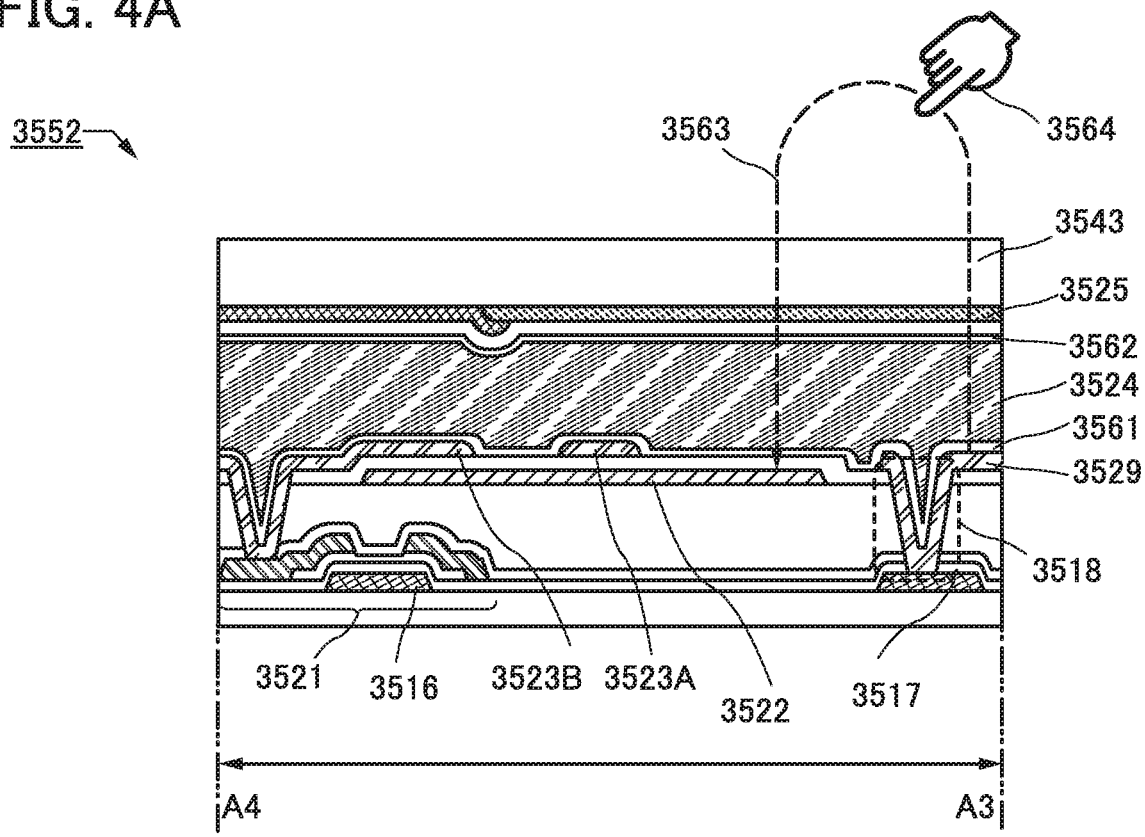
FIGS. 4A and 4B are a cross-sectional view and a plan view illustrating a structure of an input/output panel of an embodiment.

The input/output panel 3552 in FIG. 4A is different from the input/output panel 3551 in FIG. 3A in that the sensor electrode 3527 is not included.

The input/output panel 3552 in FIG. 4A includes the sensor electrode 3529 and the common electrode 3522. An electric field generated between the sensor electrode 3529 and the common electrode 3522 is indicated by the dashed line 3563. FIG. 4A also illustrates the conductive object 3564 across the electric field, for example. The components other than the above are the same as the corresponding components in the input/output panel 3551 in FIG. 3A. Note that the sensor electrode 3529 and the common electrode 3522 correspond to the pair of electrodes of the capacitive sensor portion 3515 in the input/output panel described with reference to the circuit diagram in FIG. 1B.

Figure 4B:
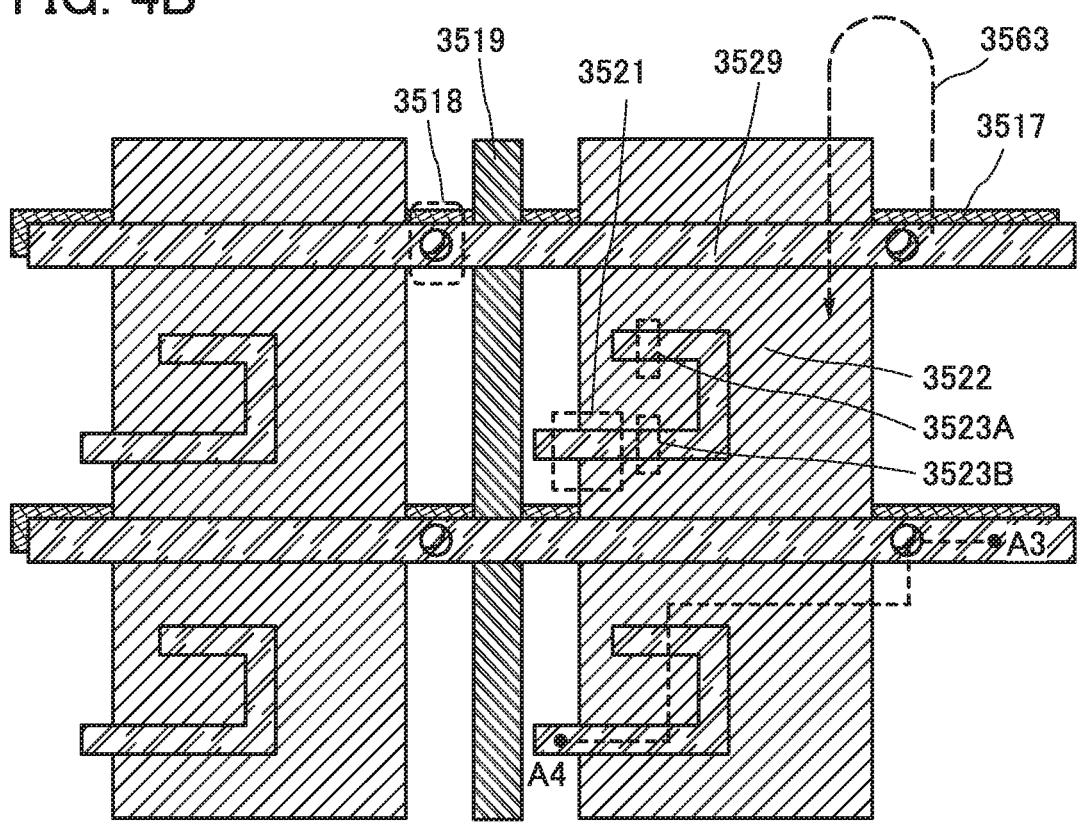

FIG. 4B is a plan view schematically illustrating structures of the wirings and the like of the input/output panel 3552 in FIG. 4A.

Part of the electric field generated between the sensor electrode 3529 and the common electrode 3522 is indicated by the dashed line 3563 (see FIG. 4B). The touch sensor of one embodiment of the present invention can sense the object 3564 that passes across the electric field. Note that the sensor electrode 3529 and the common electrode 3522 correspond to the pair of electrodes of the capacitive sensor portion 3515 (see FIG. 1B).

[Example of Sensing Method of Sensor]

Figure 5A:
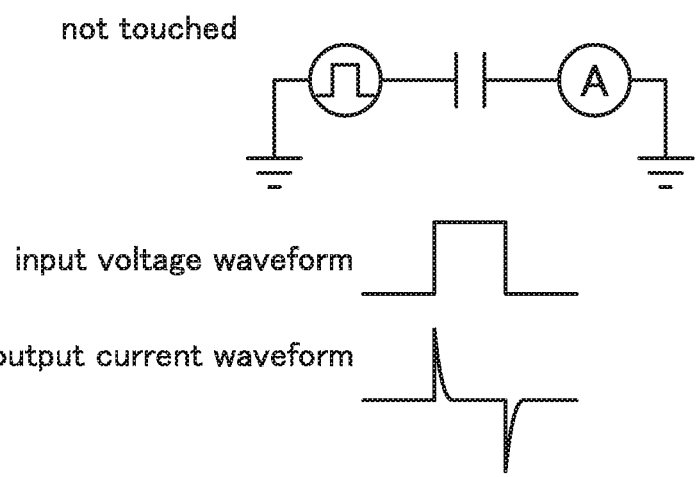
FIGS. 5A and 5B are schematic views illustrating a structure of a mutual capacitive touch sensor and input and output waveforms of an embodiment.
Figure 5B:
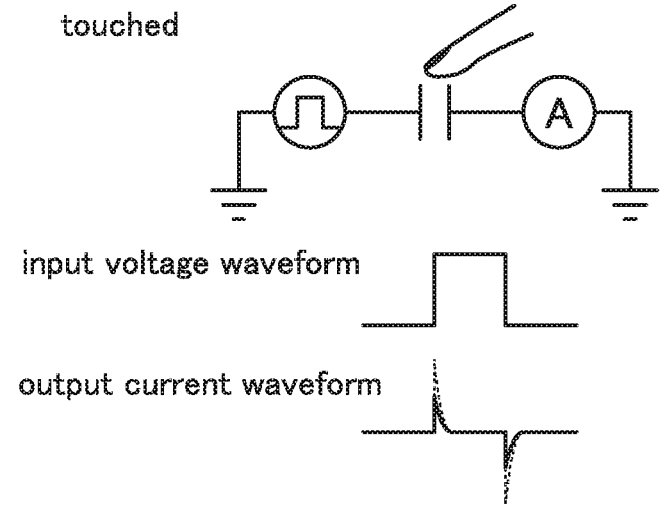

FIGS. 5A and 5B are schematic views illustrating a structure of a mutual capacitive touch sensor and input and output waveforms. The touch sensor includes a pair of electrodes. Capacitance is generated between the pair of electrodes. Input voltage is input to one of the pair of electrodes. Furthermore, a current sensing circuit that senses current flowing in the other of the pair of electrodes (or a potential of the other of the pair of electrodes) is provided.

For example, in the case where a square wave is used as an input voltage waveform as illustrated in FIG. 5A, a waveform having a sharp peak is detected as an output current waveform.

Furthermore, in the case where a conductive object is proximate to or touches a capacitor as illustrated in FIG. 5B, the capacitance value between the electrodes is decreased; accordingly, the value of output current is decreased.

By sensing a change in capacitance by using a change in output current (or potential) with respect to input voltage in this manner, the touch sensor of one embodiment of the present invention can sense proximity or a touch of an object.

[Structure Example of Touch Sensor]

Figure 5C:
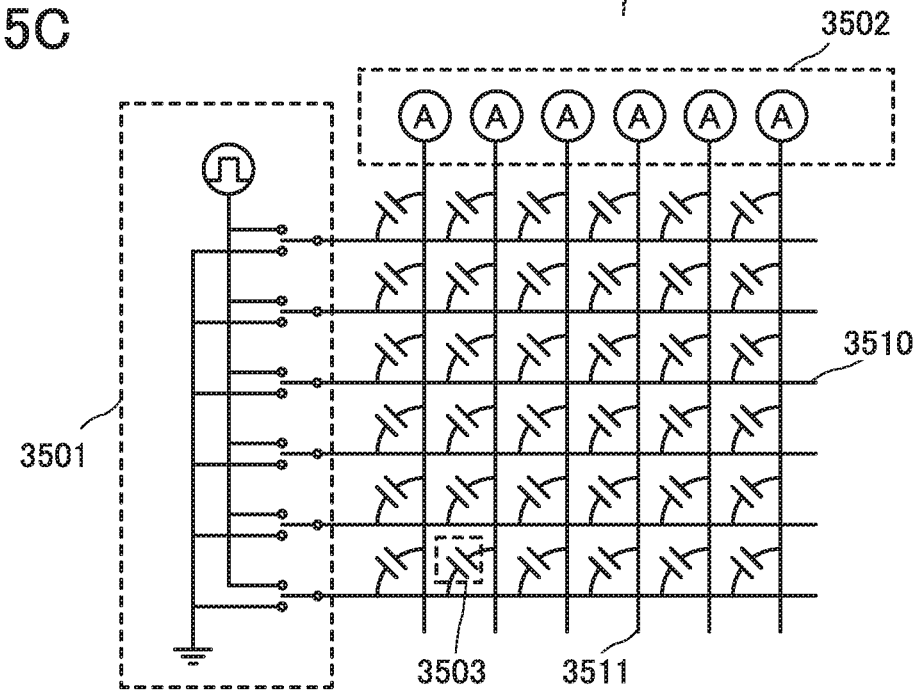
FIG. 5C illustrates a structure example of a touch sensor of an embodiment that is provided with a plurality of capacitors arranged in a matrix.

FIG. 5C illustrates a structure example of a touch sensor provided with a plurality of capacitors arranged in a matrix.

The touch sensor includes a plurality of wirings 3510 extending in an X direction (the horizontal direction of this figure) and a plurality of wirings 3511 extending in a Y direction (the vertical direction of this figure) which intersect with the plurality of wirings 3510. A capacitor 3503 is formed between two wirings intersecting with each other. The wiring 3510 corresponds to the gate wiring 3517 and the sensor electrode 3529 in the input/output panel 3551, and the wiring 3511 corresponds to the sensor electrode 3527 in the input/output panel 3551, for example (see FIGS. 3A and 3B).

One of input voltage and a common potential (including a ground potential and a reference potential) is input to the wirings 3510 extending in the X direction. This potential can be supplied from, for example, a pulse voltage output circuit 3501 that inputs a square wave. Furthermore, a current sensing circuit 3502 (e.g., a source meter or a sense amplifier) is electrically connected to the wirings 3511 extending in the Y direction and can sense current (or potential) flowing through the wirings.

The touch sensor can perform sensing of an object two dimensionally in such a manner that the touch sensor sequentially scans the plurality of wirings 3510 extending in the X direction so that input voltage is input and senses a change in current (or potential) flowing through the wirings 3511 extending in the Y direction.

Embodiment 2

This embodiment will describe a structure example of a sensor that can be used in the input/output panel of one embodiment of the present invention and is different from the structure example in Embodiment 1. The input/output panel of one embodiment of the present invention includes the display element. The input/output panel described in this embodiment includes a liquid crystal element including a layer containing a liquid crystal material and operating in an FFS mode.

Structure Example 3

The input/output panel described with reference to the circuit diagram in FIG. 1B includes the common electrode 3522 and the sensor electrode 3529. Part of a structure of a pixel in an input/output panel 3553 is described with reference to a schematic cross-sectional view in FIG. 6A, for example.

Figure 6A:
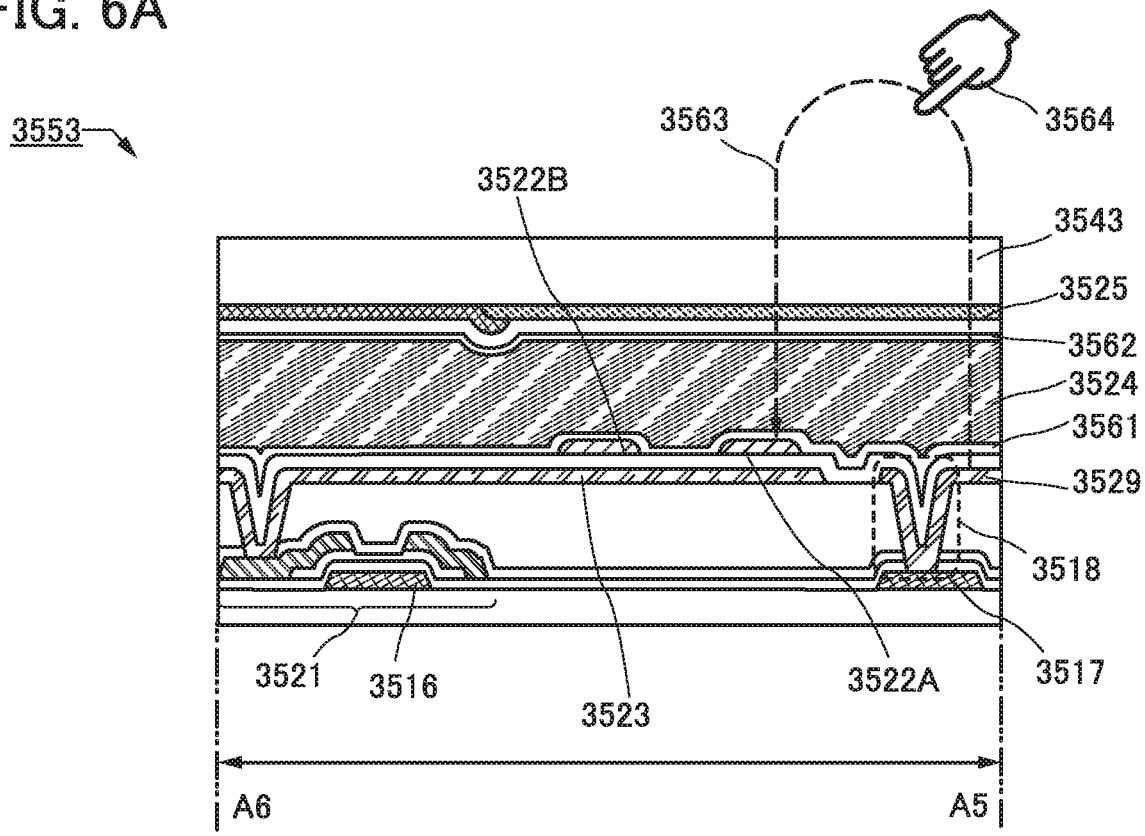
FIGS. 6A and 6B are a cross-sectional view and a plan view illustrating a structure of an input/output panel of an embodiment.

The input/output panel 3553 includes the transistor 3521, the common electrode, and the pixel electrode 3523 (see FIG. 6A). The common electrode includes a common electrode 3522A and a common electrode 3522B. The common electrode 3522A and the common electrode 3522B are electrically connected to each other. The pixel electrode 3523 contains the same material as the sensor electrode 3529. Accordingly, the pixel electrode 3523 and the sensor electrode 3529 can be formed through the same process.

Figure 6B:
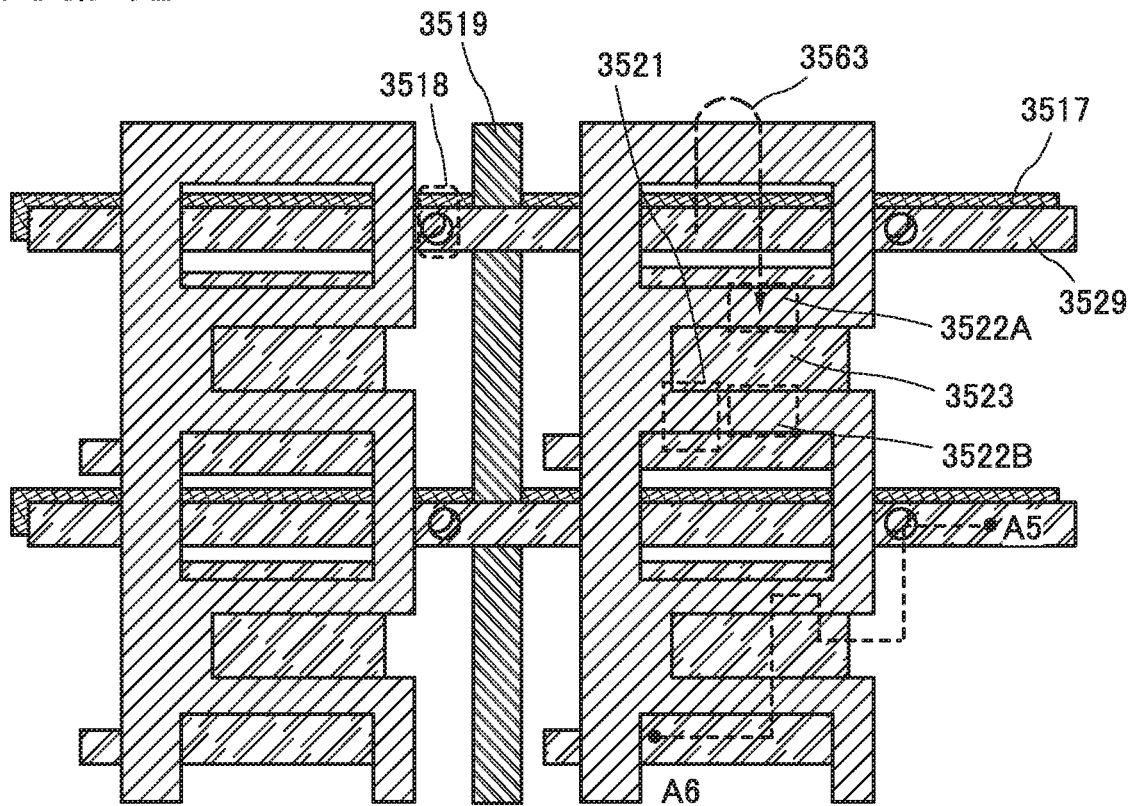

FIG. 6B is a plan view schematically illustrating structures of the wirings and the like of the input/output panel 3553 in FIG. 6A.

Part of an electric field generated between the sensor electrode 3529 and the common electrode 3522A is indicated by the dashed line 3563 (see FIG. 6B). The touch sensor of one embodiment of the present invention can sense the object 3564 that passes across the electric field. An opening is provided in the common electrode 3522B. Accordingly, the electric field across which the object is likely to pass can be generated between the sensor electrode 3529 and the common electrode 3522A. Note that the sensor electrode 3529 and the common electrode 3522A correspond to the pair of electrodes of the capacitive sensor portion 3515 (see FIG. 1B).

For the other components of the input/output panel 3553, the components of the input/output panel 3552 can be referred to.

Structure Example 4

The input/output panel described with reference to the circuit diagram in FIG. 1B includes the common electrode 3522 and the sensor electrode 3529. Part of a structure of a pixel in an input/output panel 3554 is described with reference to a schematic cross-sectional view in FIG. 7A, for example.

Figure 7A:
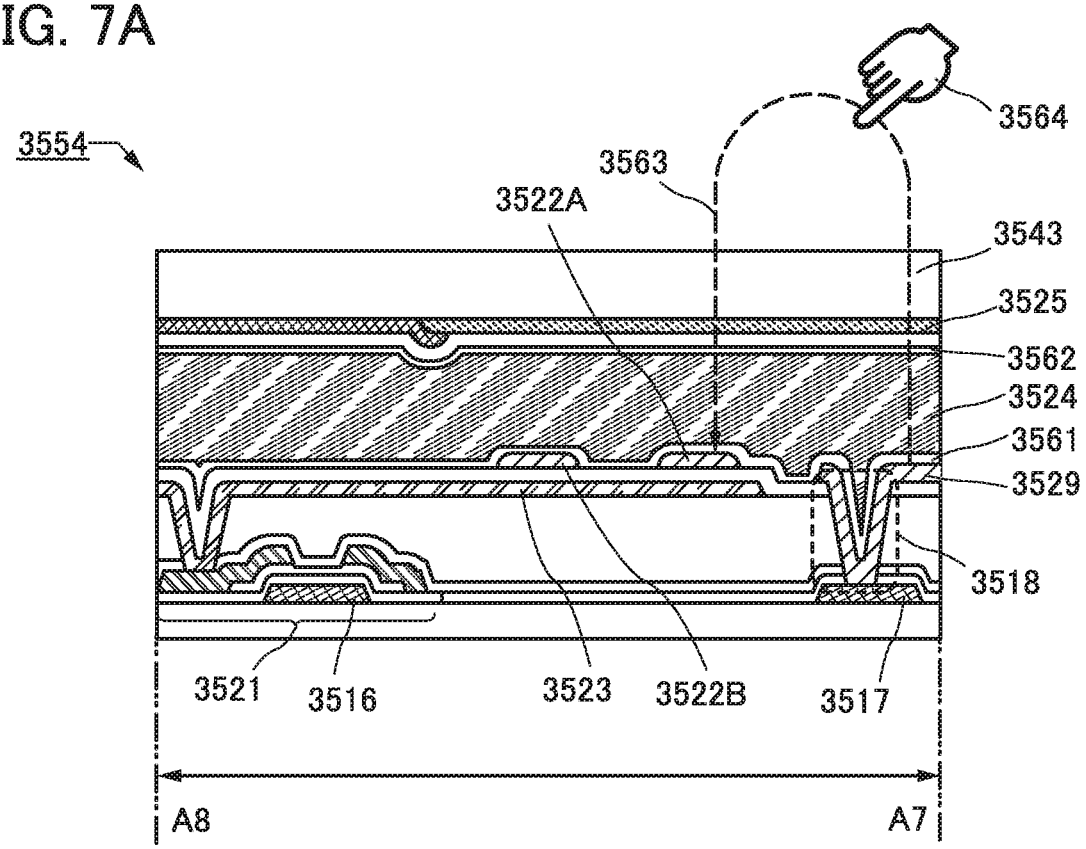
FIGS. 7A and 7B are a cross-sectional view and a plan view illustrating a structure of an input/output panel of an embodiment.

The input/output panel 3554 includes the transistor 3521, the common electrode, and the pixel electrode 3523 (see FIG. 7A). The common electrode includes the common electrode 3522A and the common electrode 3522B. The common electrode 3522A and the common electrode 3522B are electrically connected to each other. The pixel electrode 3523 contains the same material as the sensor electrode 3529. Accordingly, the pixel electrode 3523 and the sensor electrode 3529 can be formed through the same process.

Figure 7B:
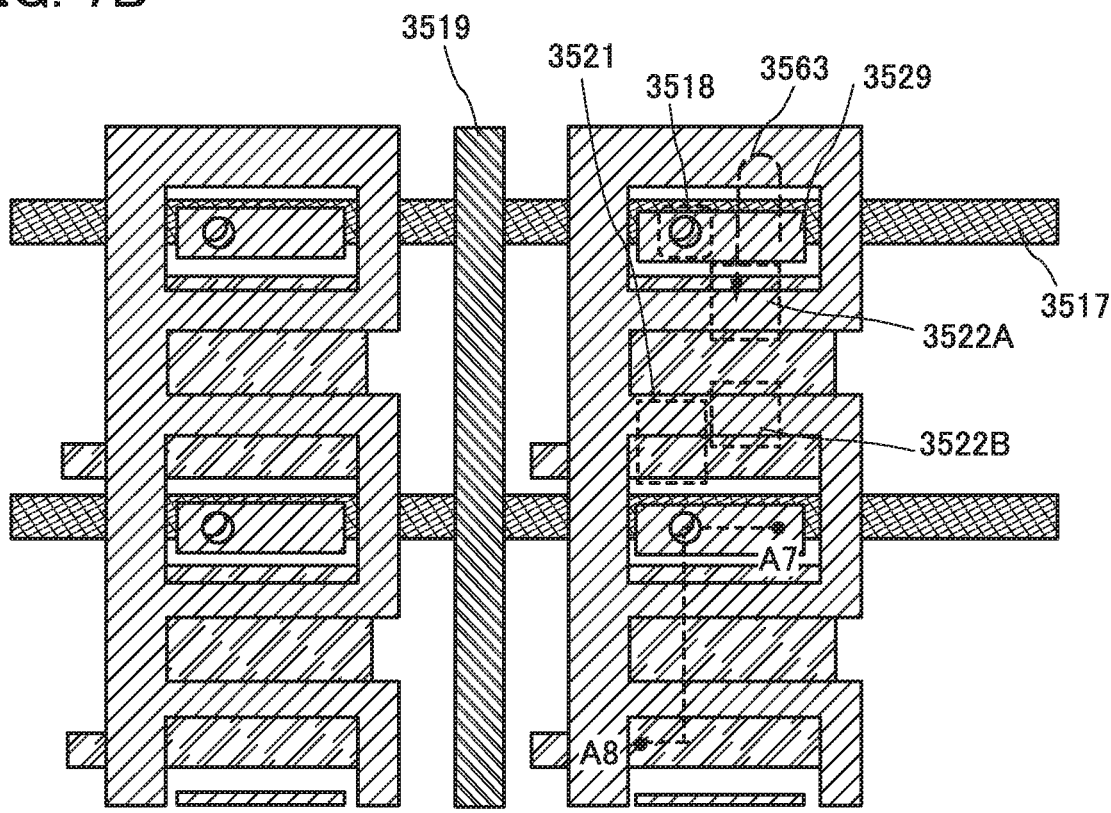

FIG. 7B is a plan view schematically illustrating structures of the wirings and the like of the input/output panel 3554 in FIG. 7A.

Part of the electric field generated between the sensor electrode 3529 and the common electrode 3522A is indicated by the dashed line 3563 (see FIG. 7B). The touch sensor of one embodiment of the present invention can sense the object 3564 that passes across the electric field. An opening is provided in the common electrode 3522B, and the sensor electrode 3529 includes a region overlapping with the opening. Note that the common electrode 3522A and the sensor electrode 3529 correspond to the pair of electrodes of the capacitive sensor portion 3515 (see FIG. 1B).

For the other components of the input/output panel 3554, the components of the input/output panel 3552 can be referred to.

Structure Example 5

The input/output panel described with reference to the circuit diagram in FIG. 1A includes the sensor electrode 3527 and the sensor electrode 3529. Part of a structure of a pixel in an input/output panel 3555 is described with reference to a schematic cross-sectional view in FIG. 8A, for example.

Figure 8A:
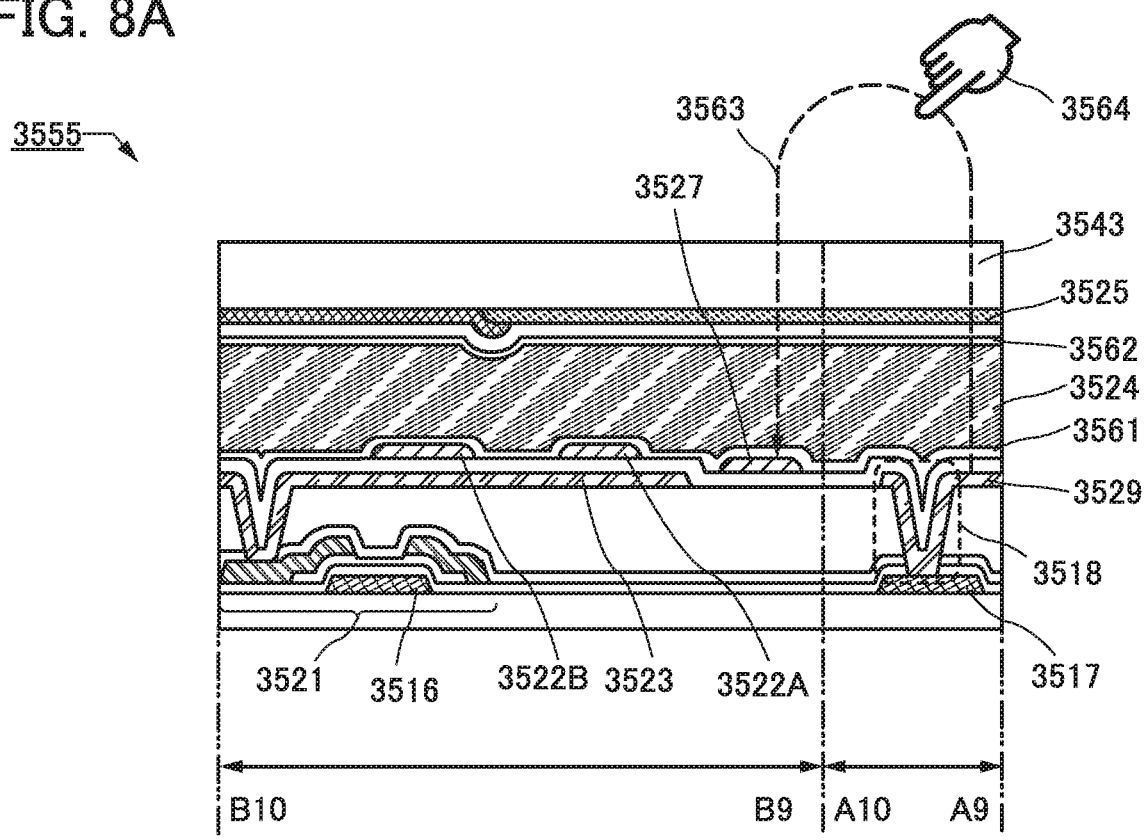
FIGS. 8A and 8B are a cross-sectional view and a plan view illustrating a structure of an input/output panel of an embodiment.

The input/output panel 3555 includes the transistor 3521, the common electrode, the sensor electrode 3527, and the pixel electrode 3523 (see FIG. 8A). The common electrode includes the common electrode 3522A and the common electrode 3522B. The common electrode 3522A and the common electrode 3522B are electrically connected to each other. The common electrode contains the same material as the sensor electrode 3527. Accordingly, the common electrode and the sensor electrode 3527 can be formed through the same process.

Figure 8B:
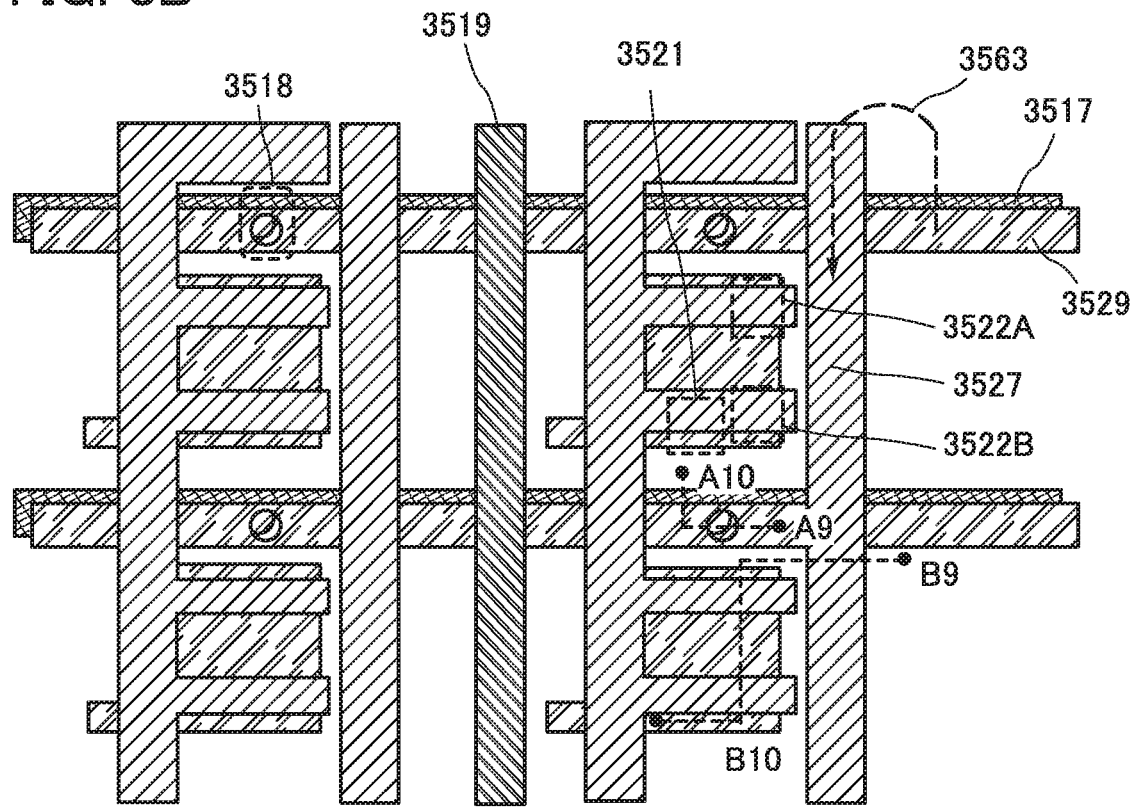

FIG. 8B is a plan view schematically illustrating structures of the wirings and the like of the input/output panel 3555 in FIG. 8A.

Part of the electric field generated between the sensor electrode 3529 and the sensor electrode 3527 is indicated by the dashed line 3563 (see FIG. 8B). The touch sensor of one embodiment of the present invention can sense the object 3564 that passes across the electric field. An opening is provided in the common electrode 3522B. Accordingly, the electric field across which the object is likely to pass can be generated between the sensor electrode 3529 and the sensor electrode 3527. Note that the sensor electrode 3529 and the sensor electrode 3527 correspond to the pair of electrodes of the capacitive sensor portion 3515 (see FIG. 1A).

For the other components of the input/output panel 3555, the components of the input/output panel 3551 can be referred to.

Embodiment 3

An example of a method for driving the touch panel of one embodiment of the present invention is described below.

Figure 9A:
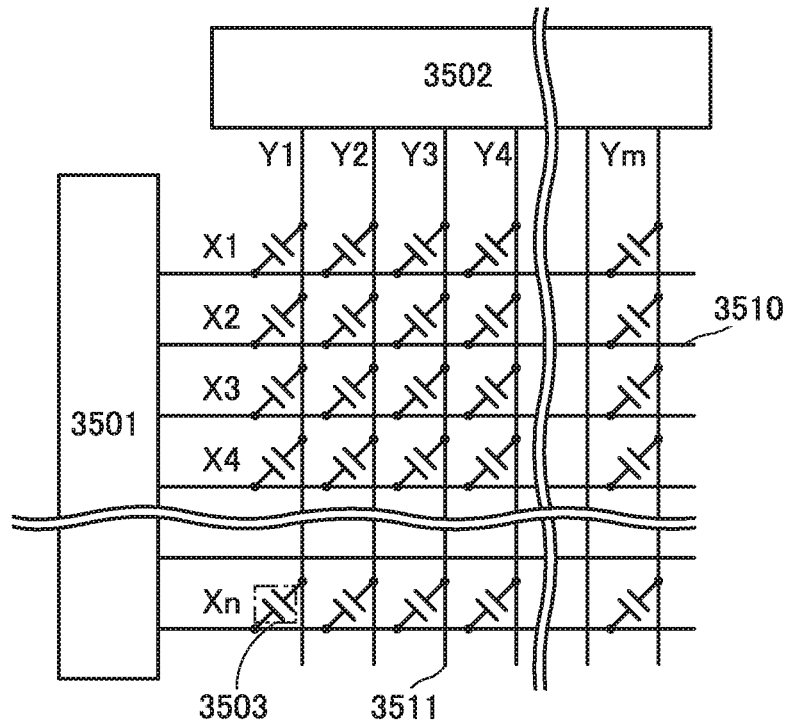
FIGS. 9A and 9B are a block diagram of wirings and a timing chart of input and output waveforms of an embodiment.

FIG. 9A is a block diagram illustrating the structure of a mutual capacitive touch sensor. In FIG. 9A, the touch sensor includes the pulse voltage output circuit 3501 and the current sensing circuit 3502. Furthermore, n wirings X1 to Xn represent the wirings 3510 to which a pulse voltage is applied, and m wirings Y1 to Ym represent the wirings 3511 that sense a change in current. FIG. 9A also illustrates a plurality of capacitors 3503 formed in regions where the plurality of wirings 3510 overlap with the plurality of wirings 3511. Note that functional replacement between the wirings 3510 and 3511 is possible.

The pulse voltage output circuit 3501 is a circuit for sequentially applying a pulse voltage to the wirings X1 to Xn. By application of a pulse voltage to the wirings X1 to Xn, an electric field is generated between the wirings 3510 and 3511 of the capacitor 3503. When the electric field between the wirings is shielded, for example, a change occurs in the capacitor 3503 (mutual capacitance). Proximity or a touch of an object can be sensed by utilizing this change.

The current sensing circuit 3502 is a circuit for sensing changes in current flowing through the wirings Y1 to Ym that are caused by the change in mutual capacitance in the capacitor 3503. No change in current value is sensed in the wirings Y1 to Ym when there is no proximity or touch of an object, whereas a decrease in current value is sensed when mutual capacitance is decreased owing to the proximity or touch of an object. Note that an integrator circuit or the like is used for sensing of current values.

Figure 9B:
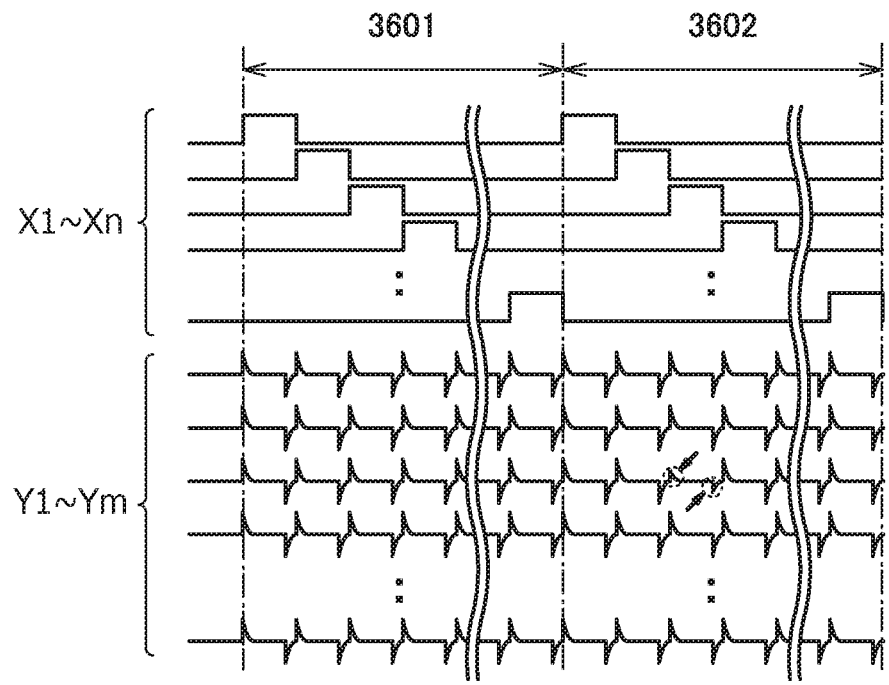

FIG. 9B is a timing chart showing input and output waveforms in the mutual capacitive touch sensor illustrated in FIG. 9A. In FIG. 9B, sensing of an object is performed in all the rows and columns in one frame period. FIG. 9B shows a period 3601 when an object is not sensed (not touched) and a period 3602 when an object is sensed (touched). Sensed current values of the wirings Y1 to Ym are shown as the waveforms of voltage values.

A pulse voltage is sequentially applied to the wirings X1 to Xn, and the waveforms of the wirings Y1 to Ym change in response to the pulse voltage. When there is no proximity or touch of an object, the waveforms of the wirings Y1 to Ym change uniformly in response to changes in the voltages of the wirings X1 to Xn. The current value is decreased at the point of proximity or a touch of an object and accordingly the waveform of the voltage value changes.

The wirings 3510 represented by X1 to Xn in the block diagram in FIG. 9A each correspond to the gate wiring 3517 of the input/output panel described in any of the other embodiments. Specifically, the wirings 3510 each correspond to the gate wiring 3517 of any of the input/output panels 3551 to 3555. For the description of coordinates of the capacitors 3503 and positions of the wirings in FIG. 9A, the wirings 3510 represented by X1 to Xn are arranged in X1 to Xn rows, and the wirings 3511 represented by Y1 to Ym are arranged in Y1 to Ym columns.

Figure 10:
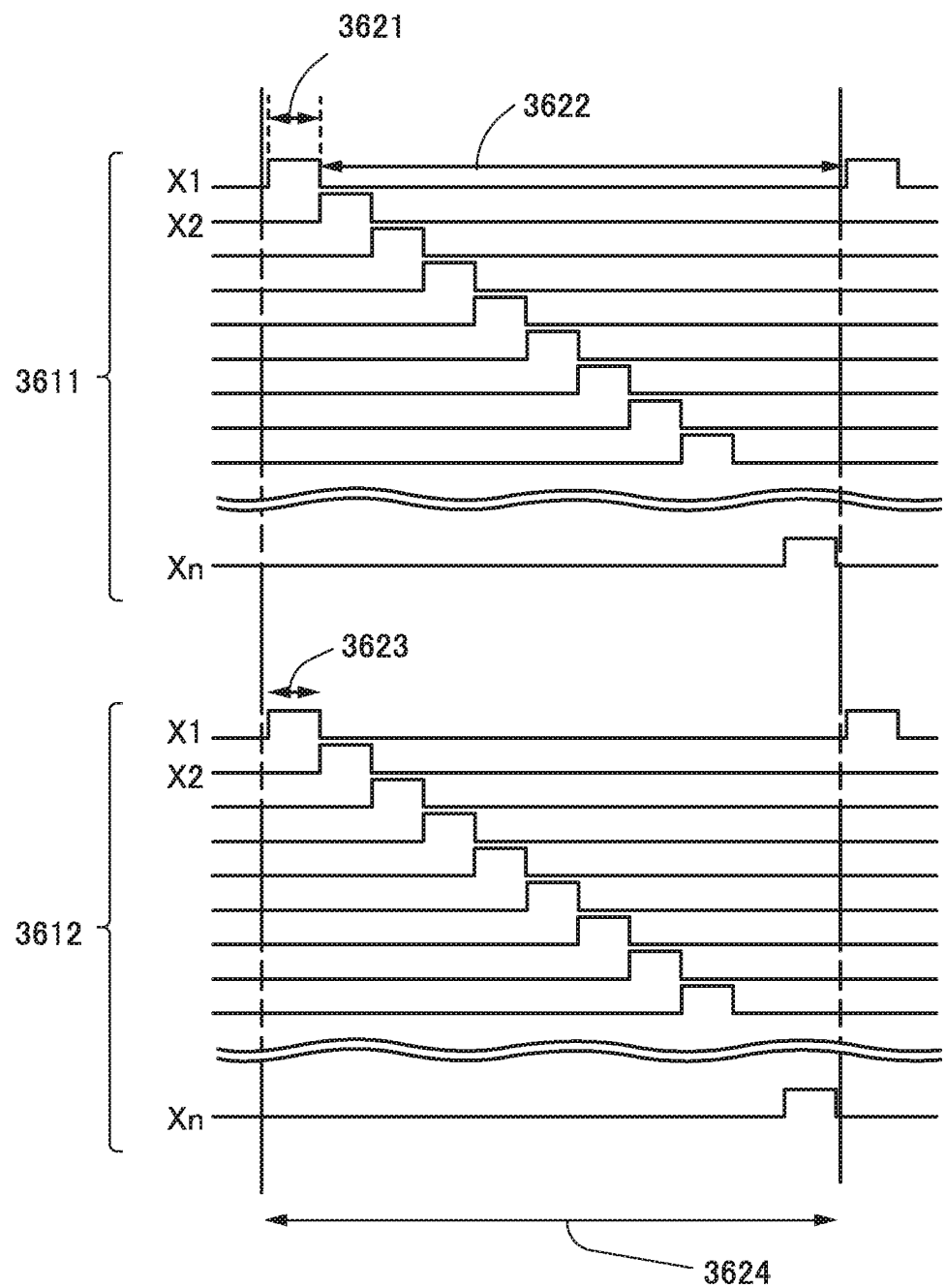
FIG. 10 is a timing chart of input and output waveforms of an embodiment.

A timing chart in FIG. 10 shows input waveforms of voltage applied to the wirings 3510 in the X1 to Xn rows. A signal 3611 is a signal for driving a display element. A signal 3612 is a signal for driving a touch sensor. In the input/output panel of one embodiment of the present invention, the gate wiring 3517 can supply both of the signals 3611 and 3612; thus, the signals 3611 and 3612 for a certain row flow in the gate wiring 3517 in the row, for example. That is, the signals 3611 and 3612 can be regarded as selection signals input to the gate wiring 3517 in FIG. 1A or FIG. 1B.

The timing chart in FIG. 10 shows an example of a method for driving an input/output panel (e.g., the input/output panel 3551) in which the common electrode 3522 is separated from the sensor electrode 3527. A vertical axis represents a change in the voltage of the gate wiring. The wirings X1 to Xn in the display element each correspond to the common electrode 3522, and those in the touch sensor each correspond to the sensor electrode 3527. In the above structure, sensing of an object by the touch sensor and writing to the display element are performed at the same time. In other words, in a period in which a selection signal is input to the gate wiring, a video signal is input to the source wiring and proximity of an object to the gate wiring is sensed.

In that case, in a display element at certain coordinates, an interval between a period 3621 for writing a video signal to the display element and the next period 3621 is a display period 3622. As described above, a period 3623 for sensing an object by the touch sensor coincides with the period 3621. A cycle in and after one period 3621 and before the next period 3621 corresponds to one frame period 3624.

Figure 11:
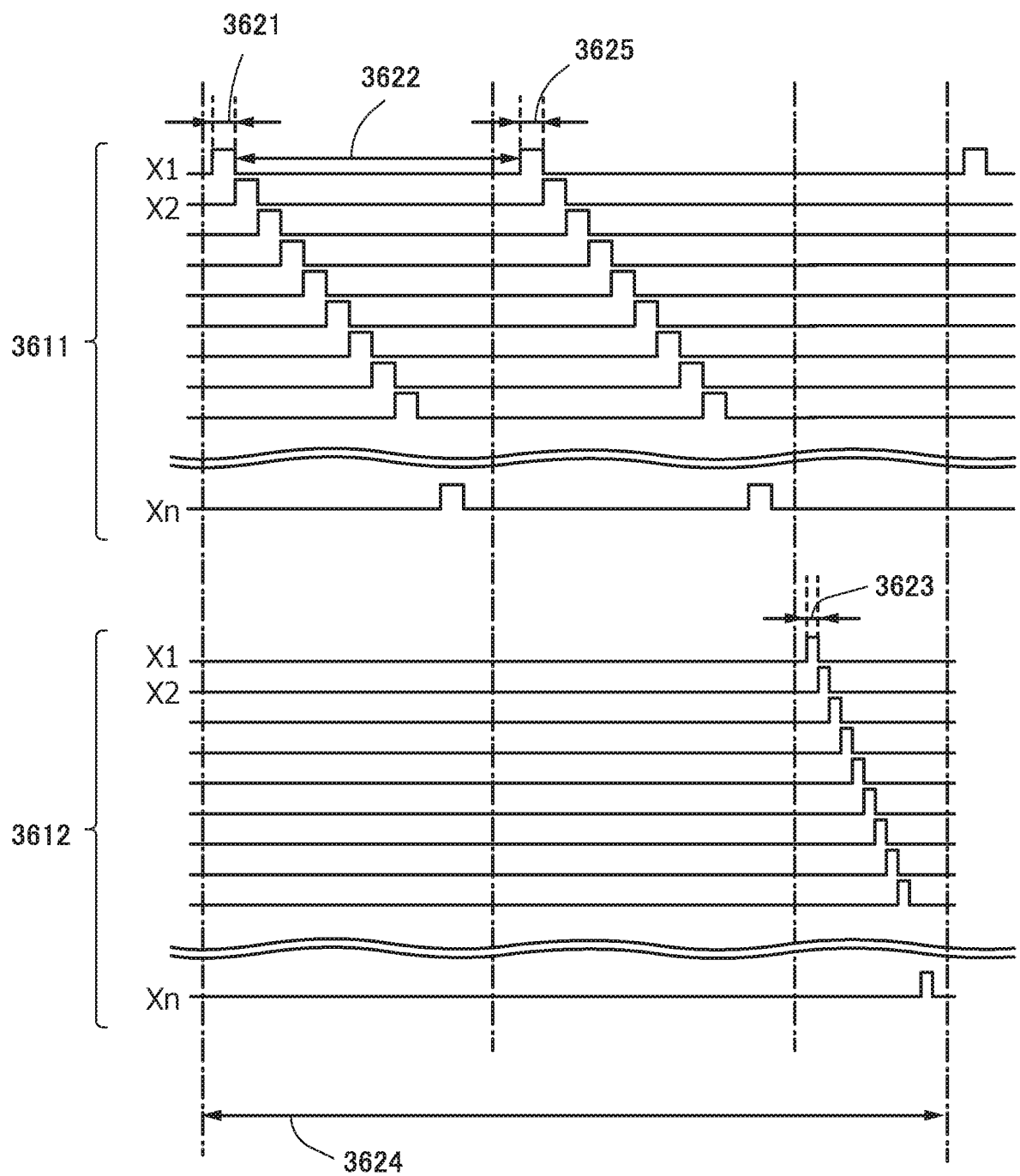
FIG. 11 is a timing chart of input and output waveforms of an embodiment.

A timing chart in FIG. 11 shows an example of a method for driving an input/output panel (e.g., the input/output panel 3552) in which the common electrode 3522 serves as one electrode of the liquid crystal element 3513 and the sensor electrode. The wirings X1 to Xn each correspond to the common electrode 3522 in the display element and the touch sensor. In the above structure, sensing of an object by the touch sensor and writing to the display element are performed in different periods.

In that case, in order to prevent crosstalk between the display element and the touch sensor at certain coordinates, a period 3625 for writing a black signal begins after the completion of the period 3621 for writing a video signal to the display element in all the rows. That is, an interval between the period 3621 and the period 3625 is the display period 3622. After the period 3625 is completed in all the rows, all the rows sequentially go through the period 3623 for sensing an object by the touch sensor. In the period 3623 for sensing an object by the touch sensor that is shown in FIG. 11, the touch sensor measures a difference between rising waveforms of gate voltage. Note that the waveforms depend on a potential of the pixel electrode 3523. In order to reduce an adverse effect on the sensing, a signal for writing the black signal is supplied to the source wiring 3519 in the period 3623. After the one frame period 3624 is completed in this manner, writing of a video signal to the display element is resumed.

When the black signal is written before sensing, the influence of the potential of the pixel electrode 3523 on potentials between the wirings 3510 and the wirings 3511 illustrated in FIG. 5C is constant; this enables more accurate sensing. A predetermined chromaticity signal may be used instead of the black signal. Alternatively, predetermined voltage may be supplied to the pixel electrode 3523 instead of the black signal.

The shorter period 3623, i.e., high-speed sensing, can lengthen the display period 3622 without the extension of the one frame period 3624.

Figure 12:
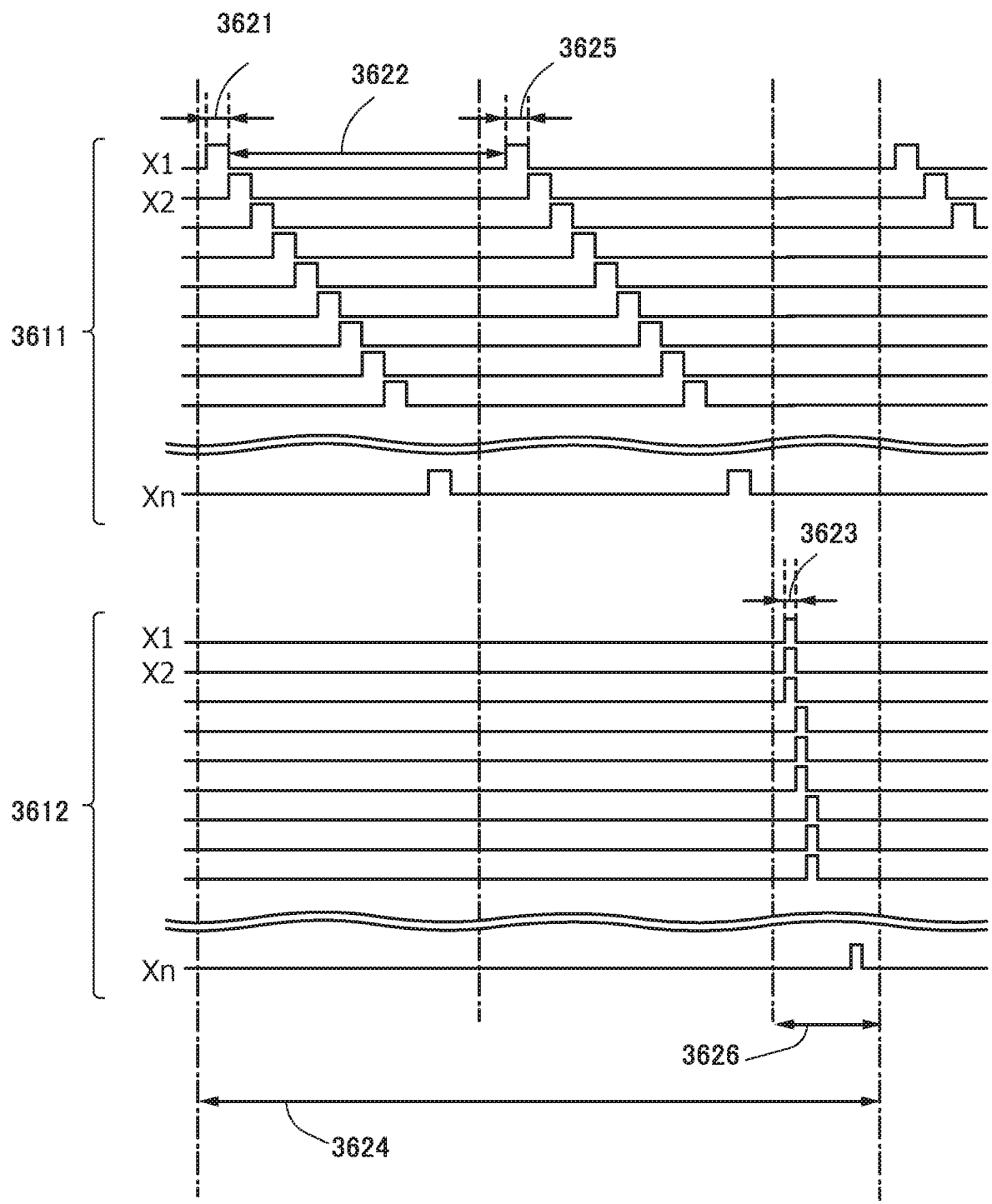
FIG. 12 is a timing chart of input and output waveforms of an embodiment.

A timing chart in FIG. 12 shows another example of a method for driving an input/output panel in which the common electrode 3522 serves as the sensor electrode and one electrode of the liquid crystal element 3513 that drives the liquid crystal element 3513.

Here, the periods 3623 for sensing an object by the touch sensor in a group of rows adjacent to each other coincide with each other. Signals in the group of rows adjacent to each other are supplied to the wirings 3511 that sense a change in current, which decreases spatial resolution of sensing. However, the total length of a sensing period 3626 is shortened; accordingly, high-speed sensing can be performed.

The group of rows adjacent to each other can be, for example, Xr to Xs rows in the structure illustrated in the block diagram in FIG. 9A. Note that r is an integer greater than or equal to 1 and less than or equal to s, and s is an integer greater than or equal to r and less than or equal to n−1. In this case, s is preferably greater than or equal to r+1. After the processing in the Xr to Xs rows, remaining unprocessed rows are processed. For example, a group of rows from the X(s+1) row that are adjacent to each other can be processed in a similar way. In this manner, processing in X1 to Xn rows is completed. Note that the above whole processing may include processing in one row. The number of rows included in each group of rows adjacent to each other may be invariable or variable. For example, the common electrode 3522 in the input/output panel 3552 (see FIG. 4B) is connected to the wiring 3511 (see FIG. 9A) that senses a change in current. In other words, the Xr to Xs rows can be connected to each other.

Figure 13:
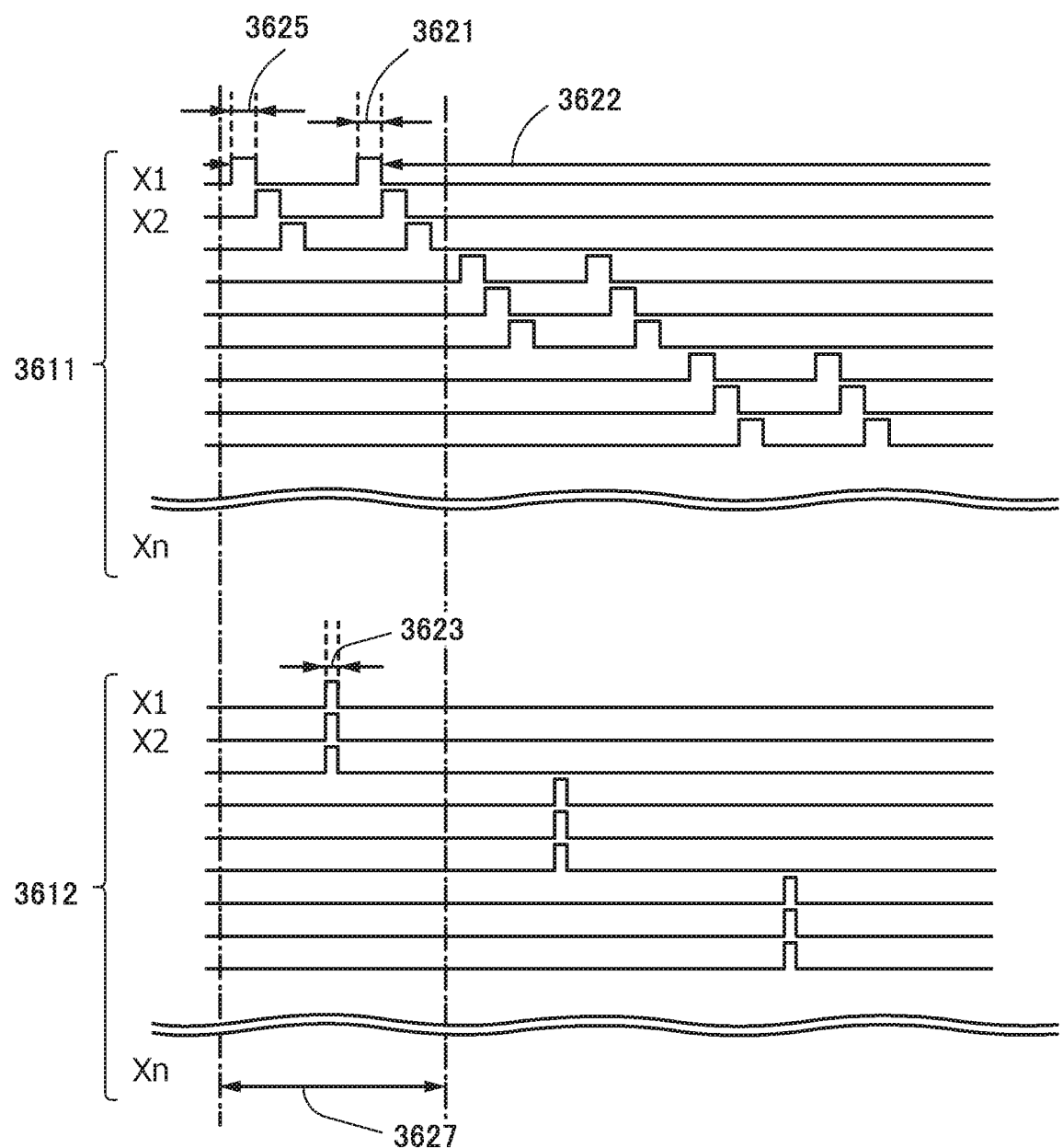
FIG. 13 is a timing chart of input and output waveforms of an embodiment.

A timing chart in FIG. 13 shows another example of a method for driving an input/output panel in which the common electrode 3522 serves as the sensor electrode and one electrode of the liquid crystal element 3513 that drives the liquid crystal element 3513.

In this case, a black signal is sequentially written to display elements in the group of rows adjacent to each other, sensing is performed in the group of rows adjacent to each other at a time, and a video signal is sequentially written to the display elements in the group of rows adjacent to each other. The above processing is performed in a period 3627, and the same processing is performed in the next group of rows adjacent to each other. When one frame period is fixed, the driving method shown in the timing chart in FIG. 13 can lengthen the display period 3622 as compared with the driving method shown in the timing chart in FIG. 12.

Note that the structures described in this embodiment can be used in appropriate combination with any of the structures described in the other embodiments.

Embodiment 4

Figure 14:
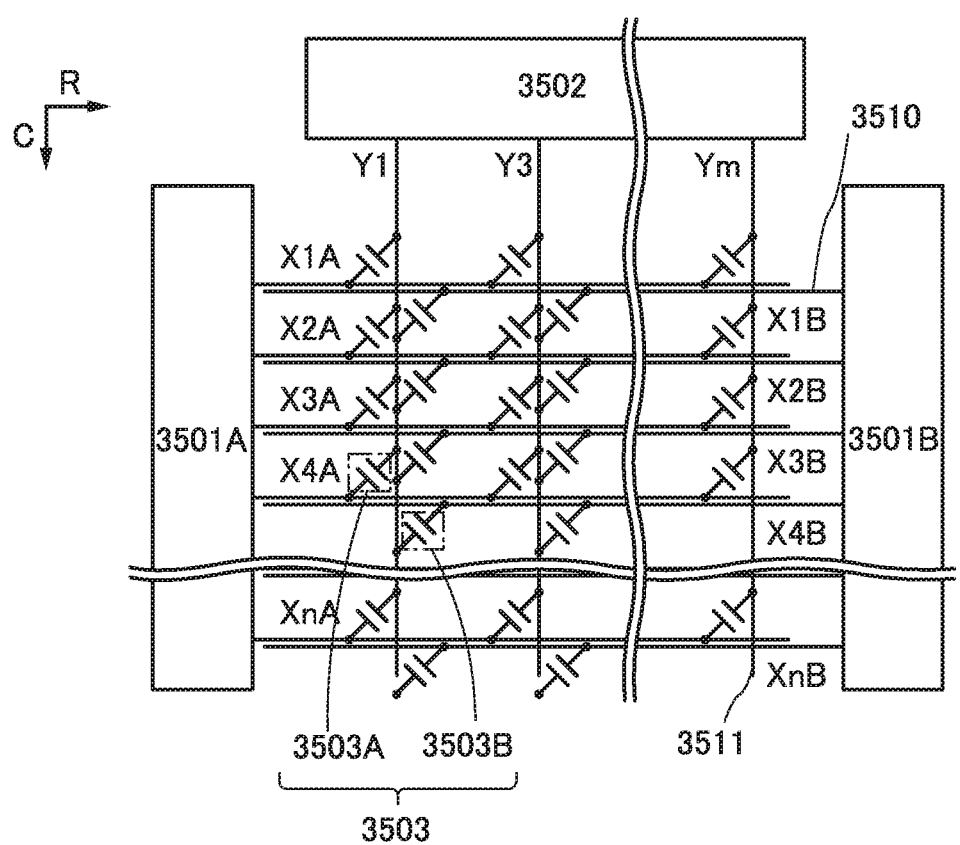
FIG. 14 is a block diagram of wirings in a touch panel of an embodiment.

This embodiment will describe the touch panel of one embodiment of the present invention in which the number of wirings 3510 is doubled and the number of wirings 3511 is reduced by half, with reference to a block diagram in FIG. 14.

The number of capacitors 3503 in the block diagram in FIG. 14 is the same as the number of capacitors 3503 in the block diagram in FIG. 9A.

In FIG. 14, the touch sensor includes a pulse voltage output circuit 3501A and a pulse voltage output circuit 3501B. Furthermore, wirings X1A to XnA and X1B to XnB represent the 2n wirings 3510 to which a pulse voltage is applied, and wirings Y1 to Ym represent the m/2 wirings 3511 that sense a change in current.

For example, a capacitor 3503A connected to the pulse voltage output circuit 3501A can be provided adjacent to a capacitor 3503B connected to the pulse voltage output circuit 3501B.

The availability of such arrangement can increase the pixel layout flexibility. For example, the resistance of the wirings 3511 can be reduced by the increased line width of the wirings 3511 while the number of pixels in the C direction is unchanged.

Note that the structures described in this embodiment can be used in appropriate combination with any of the structures described in the other embodiments.

Embodiment 5

This embodiment will describe a structure example of a sensor that can be used in the input/output panel of one embodiment of the present invention and is different from the structure examples in Embodiment 1 and Embodiment 2. Specifically, the input/output panel of one embodiment of the present invention includes a liquid crystal element or a light-emitting element.

Structure Example 6

The input/output panel described with reference to the circuit diagram in FIG. 1A includes the sensor electrode 3527. The sensor electrode 3527 is separated from the common electrode 3522. Part of a structure of a pixel in an input/output panel 3556 is described with reference to a schematic cross-sectional view in FIG. 15A, for example.

Figure 15A:
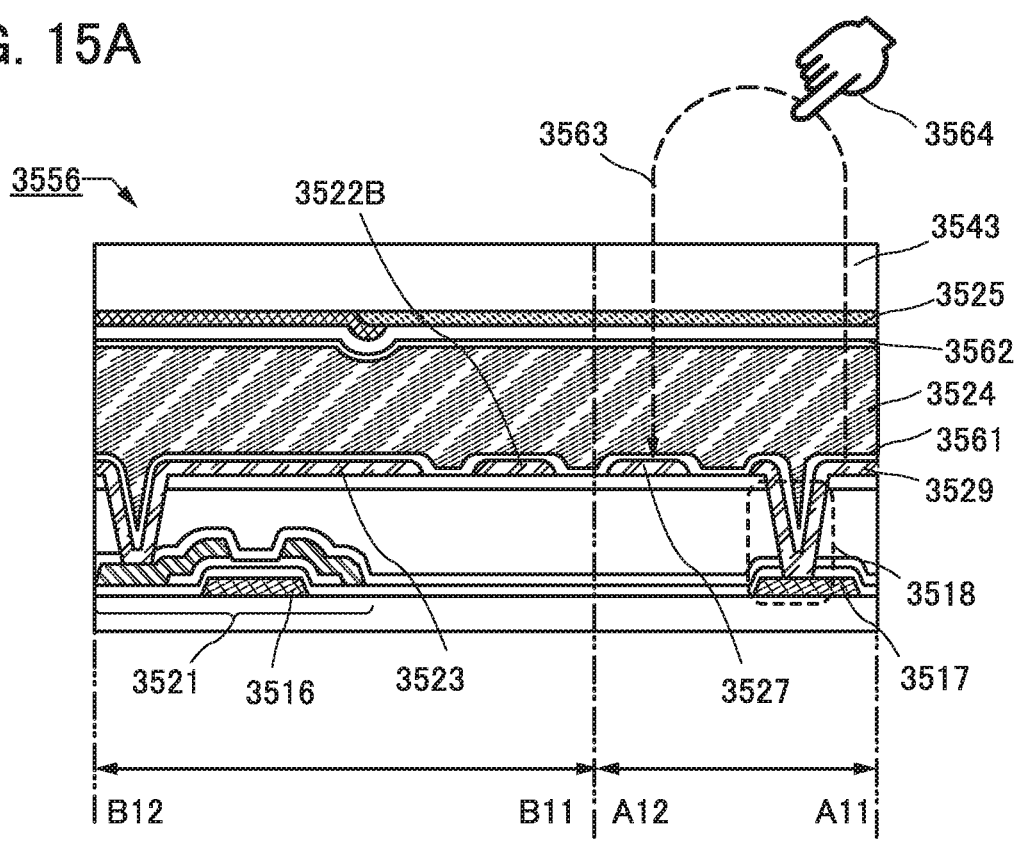
FIGS. 15A and 15B are a cross-sectional view and a plan view illustrating a structure of an input/output panel of an embodiment.

The input/output panel 3556 in FIG. 15A includes a liquid crystal element that operates in an in-plane switching (IPS) mode.

Figure 15B:
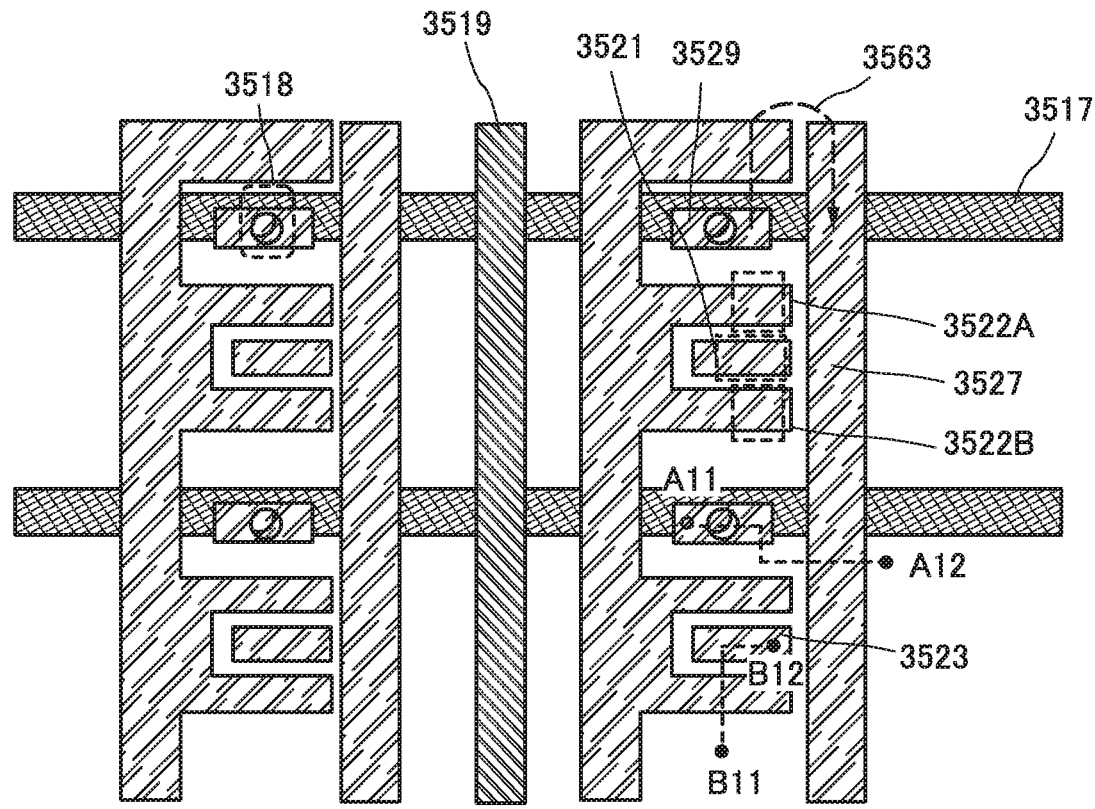

The input/output panel 3556 includes the transistor 3521, the common electrode, and the pixel electrode 3523 (see FIGS. 15A and 15B). The common electrode has a comb-like shape and includes the common electrode 3522A and the common electrode 3522B. The common electrode, the pixel electrode 3523, the sensor electrode 3527, and the sensor electrode 3529 contain the same material. Accordingly, the common electrode, the pixel electrode 3523, the sensor electrode 3527, and the sensor electrode 3529 can be formed through the same process.

FIG. 15B is a plan view schematically illustrating structures of the wirings and the like of the input/output panel 3556 in FIG. 15A.

Part of the electric field generated between the sensor electrode 3529 and the sensor electrode 3527 is indicated by the dashed line 3563 (see FIG. 15B). The touch sensor of one embodiment of the present invention can sense the object 3564 that passes across the electric field. Note that the sensor electrode 3529 and the sensor electrode 3527 correspond to the pair of electrodes of the capacitive sensor portion 3515 (see FIG. 1A).

For the other components of the input/output panel 3556, the components of the input/output panel 3551 can be referred to.

Structure Example 7

Figure 16A:
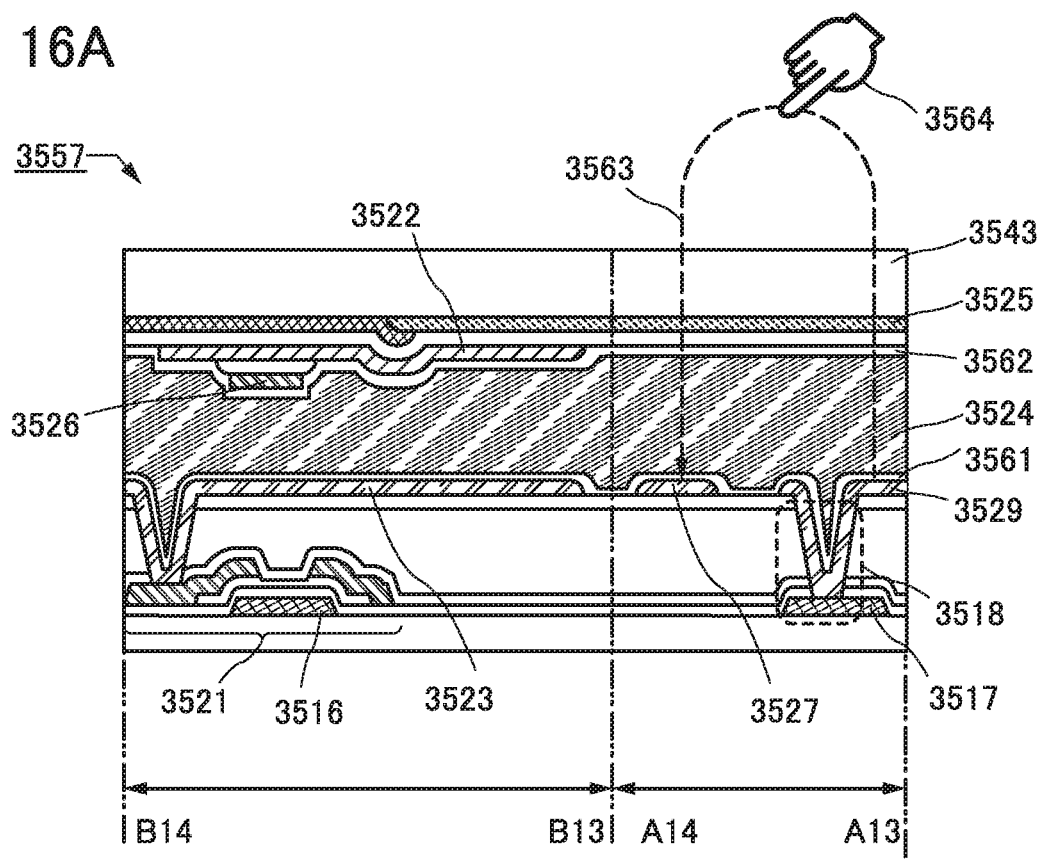
FIGS. 16A and 16B are a cross-sectional view and a plan view illustrating a structure of an input/output panel of an embodiment.

An input/output panel 3557 in FIG. 16A includes a liquid crystal element that operates in a vertical alignment (VA) mode.

The common electrode 3522 is provided so as to face the pixel electrode 3523 with the layer 3524 containing a liquid crystal material provided therebetween. A wiring 3526 is provided to overlap with the common electrode 3522. For example, the wiring 3526 can be provided to electrically connect blocks, which are not illustrated in FIG. 16A, to each other. The layer 3524 containing a liquid crystal material is positioned between the common electrode 3522 and the pixel electrode 3523. The sensor electrode 3529 contains the same material as the pixel electrode 3523. Accordingly, the sensor electrode 3529 and the pixel electrode 3523 can be formed through the same process.

Figure 16B:
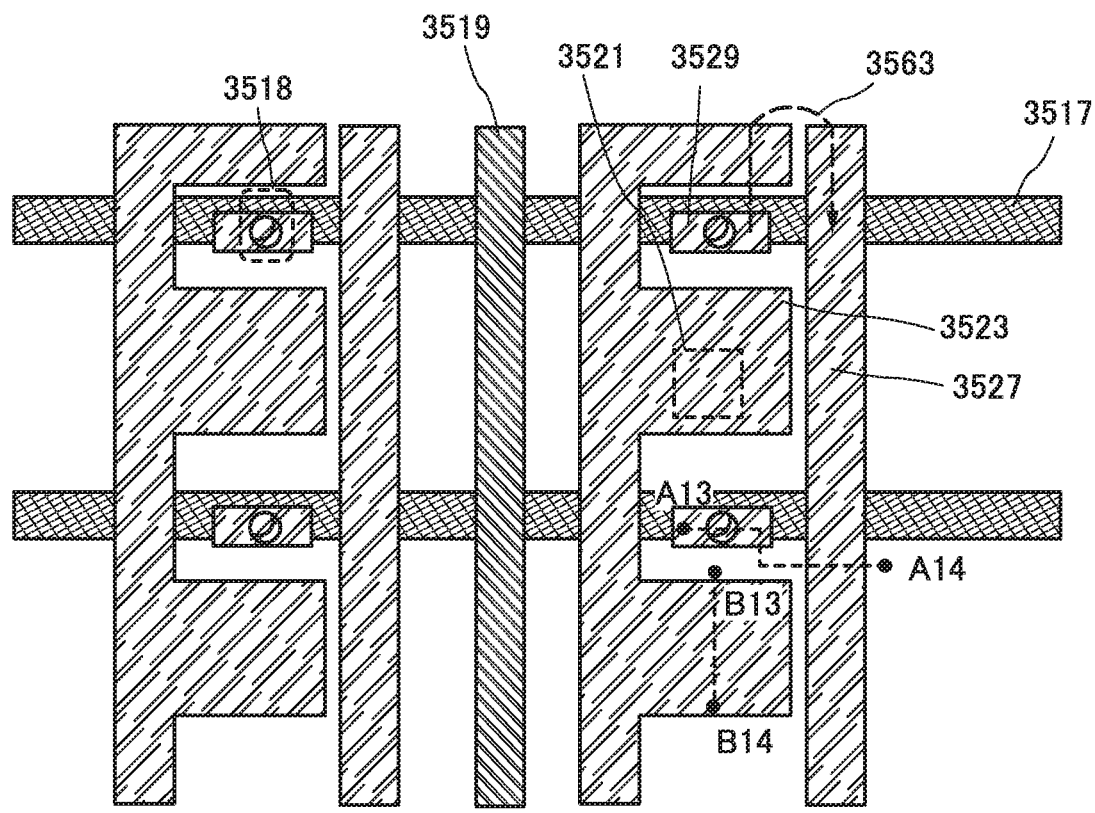

FIG. 16B is a plan view schematically illustrating structures of the wirings and the like of the input/output panel 3557 in FIG. 16A.

Part of the electric field generated between the sensor electrode 3529 and the sensor electrode 3527 is indicated by the dashed line 3563 (see FIG. 16B). The touch sensor of one embodiment of the present invention can sense the object 3564 that passes across the electric field. Note that the sensor electrode 3529 and the sensor electrode 3527 correspond to the pair of electrodes of the capacitive sensor portion 3515 (see FIG. 1A). Part of the wiring 3526 and part of the common electrode 3522 overlap with the pixel electrode 3523. In FIG. 16B, the wiring 3526 and the common electrode 3522 are not illustrated to avoid complexity of the drawing.

For the other components of the input/output panel 3557, the components of the input/output panel 3551 can be referred to.

Note that the liquid crystal element can be operated in a twisted nematic (TN) mode using the input/output panel in FIGS. 16A and 16B.

Structure Example 8

The touch panel of one embodiment of the present invention may include a light-emitting element.

Figure 17A:
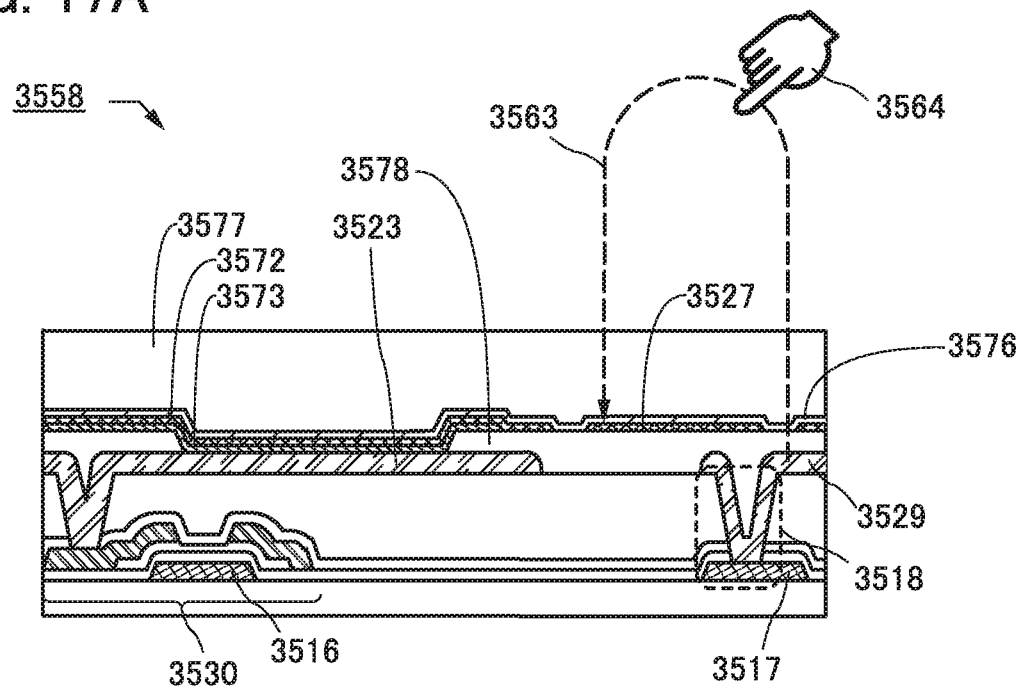
FIGS. 17A and 17B are a cross-sectional view and a circuit diagram illustrating a structure of an input/output panel of an embodiment.

FIG. 17A is a schematic cross-sectional view illustrating part of a structure of a pixel in an input/output panel 3558. The input/output panel 3558 includes a light-emitting element. The light-emitting element includes the pixel electrode 3523, an electrode 3572, and a layer 3573 containing a light-emitting material. The layer 3573 containing a light-emitting material is provided between the pixel electrode 3523 and the electrode 3572.

A conductive material transmitting visible light is used for the electrode 3572. Thus, light can be extracted from the light-emitting element. The extracted light can be visually recognized. For example, a conductive material transmitting visible light can be used for a cathode or an anode. In this embodiment, a conductive material transmitting visible light is used for the electrode 3572 serving as a cathode (see FIG. 17A).

A conductive material reflecting visible light can be used for the pixel electrode 3523. Specifically, the pixel electrode 3523 can have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component.

A conductive material transmitting visible light can be used for the electrode 3572. Specifically, a conductive oxide such as indium oxide, indium tin oxide, indium zinc oxide, zinc oxide, or zinc oxide to which gallium is added can be used for the electrode 3572. A conductive film transmitting visible light is described later.

The pixel electrode 3523 contains the same material as the sensor electrode 3529. Accordingly, the pixel electrode 3523 and the sensor electrode 3529 can be formed through the same process. The pixel electrode 3523 is not connected to the sensor electrode 3529. The electrode 3572 includes a region not overlapping with the sensor electrode 3529. For example, the electrode 3572 includes an opening formed using a shadow mask.

The input/output panel 3558 includes an insulating layer 3576 and a resin layer 3577. The insulating layer 3576 prevents diffusion of water from the resin layer 3577 to the layer 3573 containing a light-emitting material.

Figure 17B:
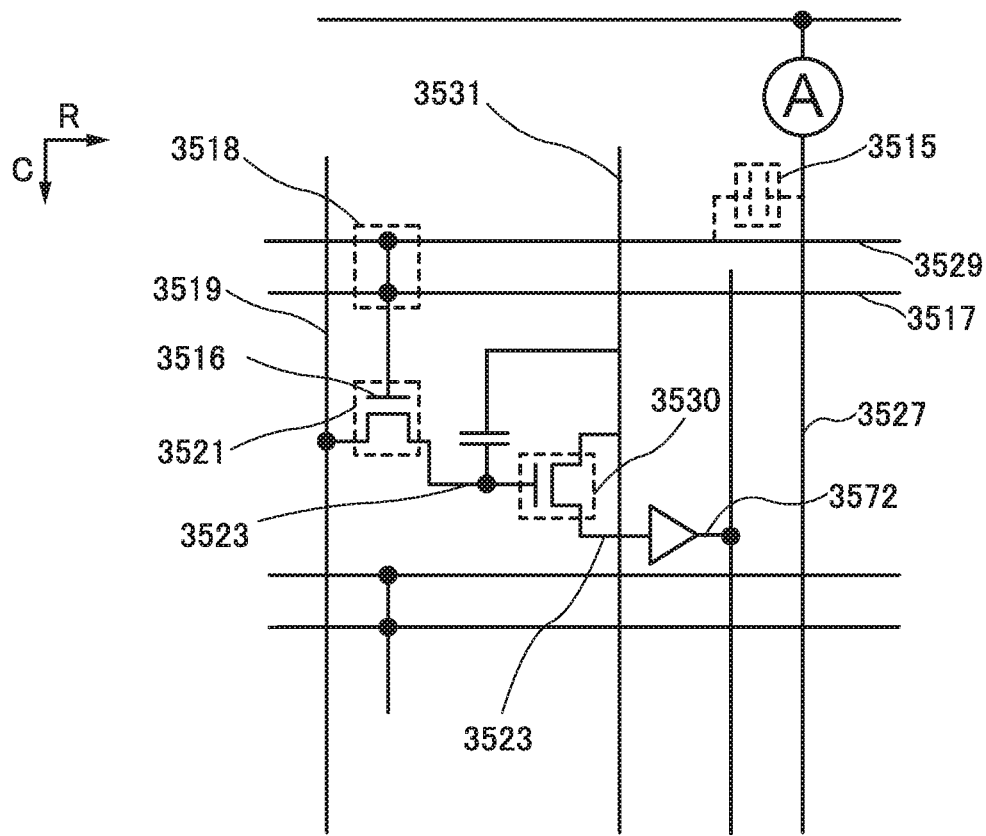

The input/output panel 3558 includes the pixel electrode 3523. The pixel electrode 3523 is electrically connected to one of a source electrode and a drain electrode of a transistor 3530. The other of the source electrode and the drain electrode of the transistor 3530 is electrically connected to a power supply line 3531 (see FIG. 17B). The transistor 3530 has a function of controlling the light-emitting element. The transistor 3530 is a driving transistor. A gate electrode of the transistor 3530 is electrically connected to one of the source electrode and the drain electrode of the switching transistor 3521. The gate electrode of the switching transistor 3521 is electrically connected to the gate wiring 3517. The pixel electrode 3523 and the sensor electrode 3529 serve as a pair of electrodes, and a change in capacitance is sensed, so that capacitive sensing is performed.

A partition 3578, which is used for separate formation of the layer 3573 containing a light-emitting material in each pixel, is between the pixel electrode 3523 and the layer 3573 containing a light-emitting material. The partition 3578 is formed using an inorganic insulating film or an organic insulating film. As the inorganic insulating film, a silicon nitride film or a silicon nitride oxide film formed by a CVD method or an SOG method can be used, for example. As the organic insulating film, an acrylic resin film or the like can be used.

With the use of a wet etching method, the partition 3578 can be easily formed to have a tapered sidewall. The sidewall of the partition 3578 should have a sufficiently gentle slope; otherwise, the step will cause the serious deterioration of an EL layer.

The partition 3578 is formed also in the contact region 3518. An uneven surface of the pixel electrode due to an uneven surface of the contact region 3518 is thus filled with the partition 3578, so that deterioration of the EL layer caused by the step can be prevented.

Part of the electric field generated between the sensor electrode 3529 and the sensor electrode 3527 is indicated by the dashed line 3563 (see FIG. 17A). The touch sensor of one embodiment of the present invention can sense the object 3564 that passes across the electric field. Note that the sensor electrode 3529 and the sensor electrode 3527 correspond to the pair of electrodes of the capacitive sensor portion 3515 (see FIG. 1A). Note that any of the driving methods described in FIG. 11, FIG. 12, and FIG. 13 can be used to drive the input/output panel.

The sensor electrode 3527 contains the same material as the electrode 3572. Accordingly, the sensor electrode 3527 and the electrode 3572 can be formed through the same process. The sensor electrode 3527 can be formed apart from the electrode 3572. When the sensor electrode 3527 is used as a common electrode, the sensor electrode 3527 and the sensor electrode 3529 can be a pair of electrodes of a capacitor portion.

Structure Example 9

Figure 18A:
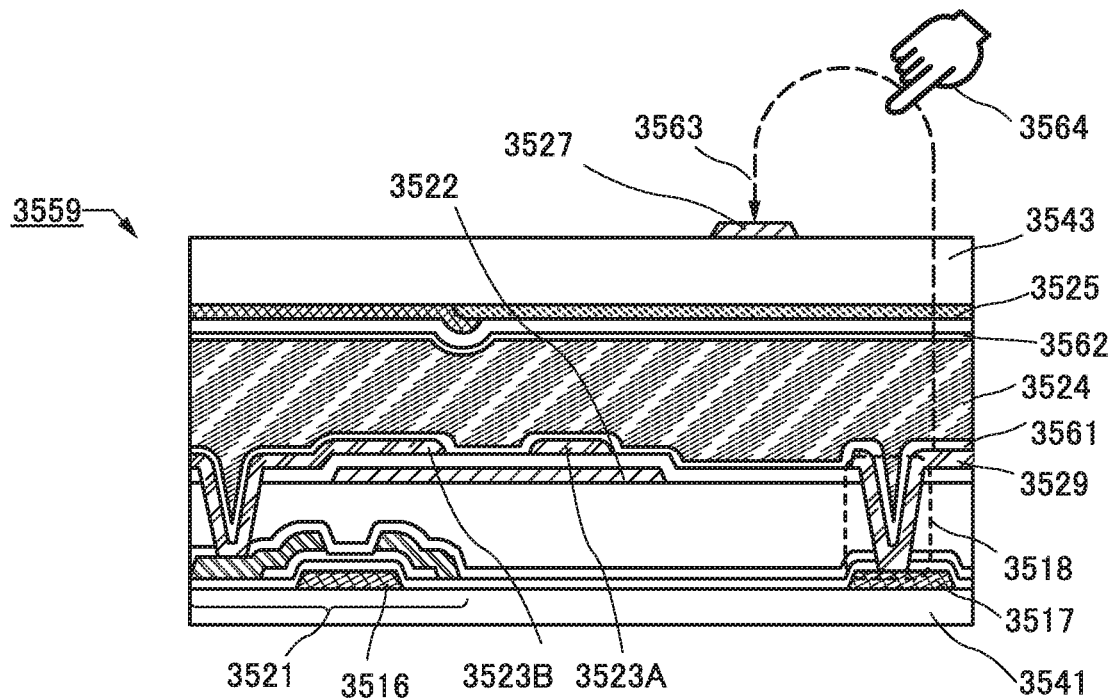
FIGS. 18A and 18B are cross-sectional views each illustrating a structure of an input/output panel of an embodiment.

An input/output panel 3559 in FIG. 18A is different from the input/output panel 3551 in FIG. 3A in that the sensor electrode 3527 is formed over the substrate 3543. In this case, the substrate 3543 is positioned between the sensor electrode 3527 and the layer 3524 containing a liquid crystal material.

Formation of the sensor electrode 3527 in the above position enables a line of electric force across which the object 3564 is likely to pass to be generated between the sensor electrode 3529 and the sensor electrode 3527. As a result, the sensitivity of a capacitive sensor can be improved.

Structure Example 10

A conductive film transmitting visible light can be used for the common electrode 3522 of the input/output panel 3557 in FIG. 16A or the electrode 3572 of the input/output panel 3558 in FIG. 17A. For example, a conductive film whose reflectance is greater than or equal to 1%, preferably greater than or equal to 5% and less than 100% and whose light transmittance is greater than or equal to 1%, preferably greater than or equal to 10% and less than 100% with respect to light with a wavelength in a range greater than or equal to 400 nm and less than 800 nm can be used for the common electrode 3522 or the electrode 3572.

Specifically, a conductive material containing silver (Ag) or aluminum (Al) and having a thickness of 1 nm to 30 nm, preferably 1 nm to 15 nm can be used for the common electrode 3522 or the electrode 3572.

A material containing an element selected from indium, tin, zinc, gallium, and silicon can be used for the common electrode 3522 or the electrode 3572. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used for the common electrode 3522 or the electrode 3572.

A film containing graphene or graphite can be used for the common electrode 3522 or the electrode 3572. Specifically, a film containing graphene formed by reducing a film containing graphene oxide can be used. Note that the reduction can be performed by applying heat or using a reducing agent, for example.

A metal oxide typified by an In—Ga—Zn oxide can be used for the common electrode 3522 or the electrode 3572. For example, a stacked film in which a nitride insulating film such as a silicon nitride film is formed over the metal oxide can be used for the common electrode 3522 or the electrode 3572. Note that nitrogen or hydrogen can be supplied from the nitride insulating film to the metal oxide by thermal diffusion. Thus, a carrier density of the metal oxide can be increased. Furthermore, the metal oxide can be an oxide conductor (OC).

An oxide conductor having a thickness of greater than or equal to 30 nm and less than or equal to 500 nm, or greater than or equal to 100 nm and less than or equal to 400 nm can be used for the common electrode 3522 or the electrode 3572.

A conductive film transmitting visible light can be used for one or more of the pixel electrode 3523, the sensor electrode 3527, the sensor electrode 3529, and the electrode 3572. Furthermore, a display region of a display element can be formed to overlap with any of the electrodes formed using the conductive film transmitting visible light. Thus, display light of the display element can pass through one or more of the pixel electrode 3523, the sensor electrode 3527, the sensor electrode 3529, and the electrode 3572. A user can see display that has passed through one or more of the pixel electrode 3523, the sensor electrode 3527, the sensor electrode 3529, and the electrode 3572.

Structure Example 11

Figure 18B:
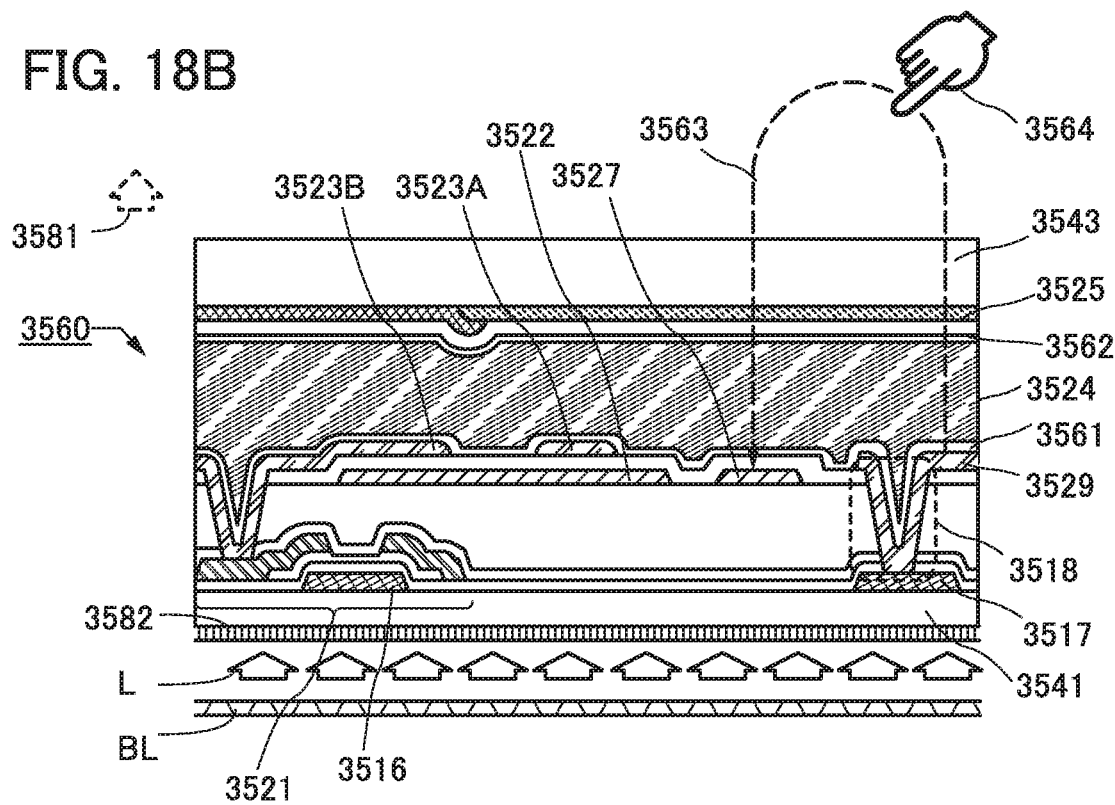

An input/output panel 3560 in FIG. 18B includes a transmissive or transflective liquid crystal element. The input/output panel 3560 is different from the input/output panel 3551 described with reference to FIG. 3A in Embodiment 1 in that a backlight BL is included. The common electrode 3522, the pixel electrode 3523A, and the pixel electrode 3523B transmit visible light.

The backlight BL emits light L in the direction indicated by an arrow 3581. By the backlight BL, the layer 3524 containing a liquid crystal material can be irradiated with light. A direct-below light source or a side light source can be used as the backlight BL, for example.

The input/output panel 3560 includes a functional film 3582. For example, a polarizing plate can be used for the functional film 3582. Although not illustrated, another functional film can be provided so that the layer containing a liquid crystal material is positioned between the functional film and the functional film 3582.

A transmissive liquid crystal element including a conductive film having a function of transmitting visible light can be used in the input/output panel described in this specification. A backlight that supplies different colored light in rotation with a field-sequential color system enables color display without a coloring film over the liquid crystal element. When the backlight supplies light of all colors, white display can be obtained.

For example, a reflective liquid crystal element and a polarizing plate can be used in the input/output panel 3560. Specifically, the polarizing plate can be provided on the display surface side of the reflective liquid crystal element.

A light diffusion plate can be provided on the display surface side of any of the input/output panels. Accordingly, visibility can be improved.

Note that two or more of the structures of the input/output panels selected from those in Embodiments 1 to 5 can be used in appropriate combination. For example, three electrodes can be used in a liquid crystal element that operates in a mode other than an FFS mode or a VA mode. Alternatively, a display element driven by another display method can be used.

This embodiment can be implemented in combination with any of the other embodiments described in this specification as appropriate.

Embodiment 6

In this embodiment, an example of a method for driving the touch panel of one embodiment of the present invention is described with reference to drawings.

[Example of Sensing Method of Sensor]

Figure 24:
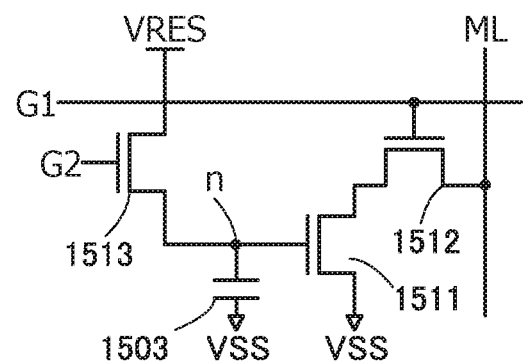
FIG. 24 is a circuit diagram of a touch sensor of an embodiment.

Although FIG. 9A is a passive matrix touch sensor in which only the capacitor is provided at the intersection of wirings as a touch sensor, an active matrix touch sensor including a transistor and a capacitor may be used. FIG. 24 is a sensor circuit included in an active matrix touch sensor.

The sensor circuit includes a capacitor 1503 and transistors 1511, 1512, and 1513. A signal G2 is input to a gate of the transistor 1513. A voltage VRES is applied to one of a source and a drain of the transistor 1513, and one electrode of the capacitor 1503 and a gate of the transistor 1511 are electrically connected to the other of the source and the drain of the transistor 1513. One of a source and a drain of the transistor 1511 is electrically connected to one of a source and a drain of the transistor 1512, and a voltage VSS is applied to the other of the source and the drain of the transistor 1511. A signal G1 is input to a gate of the transistor 1512, and a signal line ML is electrically connected to the other of the source and the drain of the transistor 1512. The voltage VSS is applied to the other electrode of the capacitor 1503.

Next, the operation of the sensor circuit will be described. First, a potential for turning on the transistor 1513 is supplied as the signal G2, and a potential with respect to the voltage VRES is thus applied to a node n connected to the gate of the transistor 1511. Then, a potential for turning off the transistor 1513 is applied as the signal G2, whereby the potential of the node n is held.

Then, mutual capacitance of the capacitor 1503 changes owing to the approach or contact of an object such as a finger, and accordingly the potential of the node n is changed from VRES.

In reading operation, a potential for turning on the transistor 1512 is supplied as the signal G1. Current flowing through the transistor 1511, that is, current flowing through the signal line ML is changed in response to the potential of the node n. By sensing this current, the approach or contact of an object can be sensed.

It is preferable that the transistors 1511, 1512, and 1513 each include an oxide semiconductor in a semiconductor layer where a channel is formed. In particular, by using an oxide semiconductor in a semiconductor layer where a channel of the transistor 1513 is formed, the potential of the node n can be held for a long time and the frequency of operation (refresh operation) of resupplying VRES to the node n can be reduced.

[Example of Driving Method for Display Device]

Figure 25A:
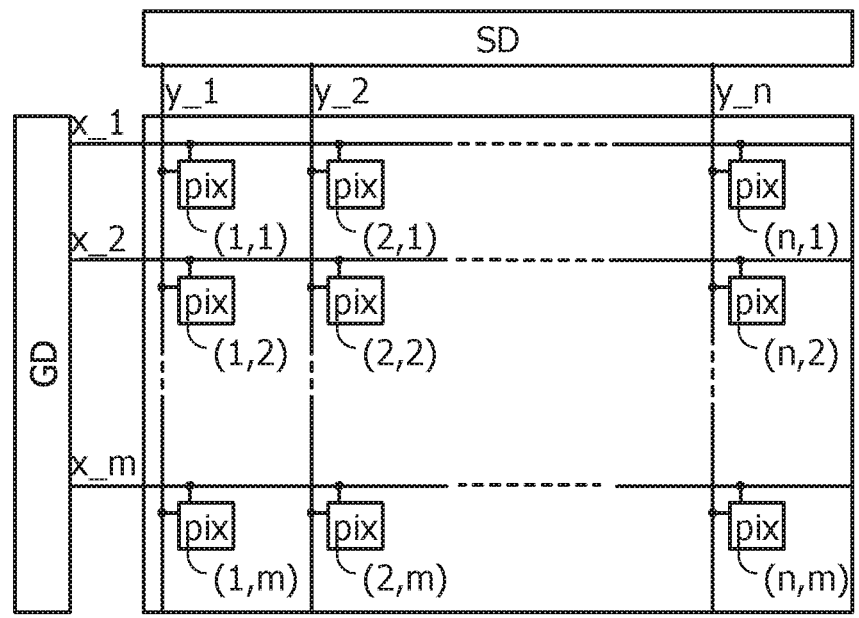
FIGS. 25A and 25B are a block diagram and a timing chart of a display device of an embodiment.

FIG. 25A is a block diagram illustrating an example of a structure of a display device. FIG. 25A illustrates a gate driver circuit GD, a source driver circuit SD, and a pixel pix. In FIG. 25A, gate lines x_1 to x_m (m is a natural number)

electrically connected to the gate driver circuit GD and source lines y_1 to y_n (n is a natural number) electrically connected to the source driver circuit SD are illustrated. Corresponding to these lines, the pixels pix are denoted by (1, 1) to (n, m).

Figure 25B:
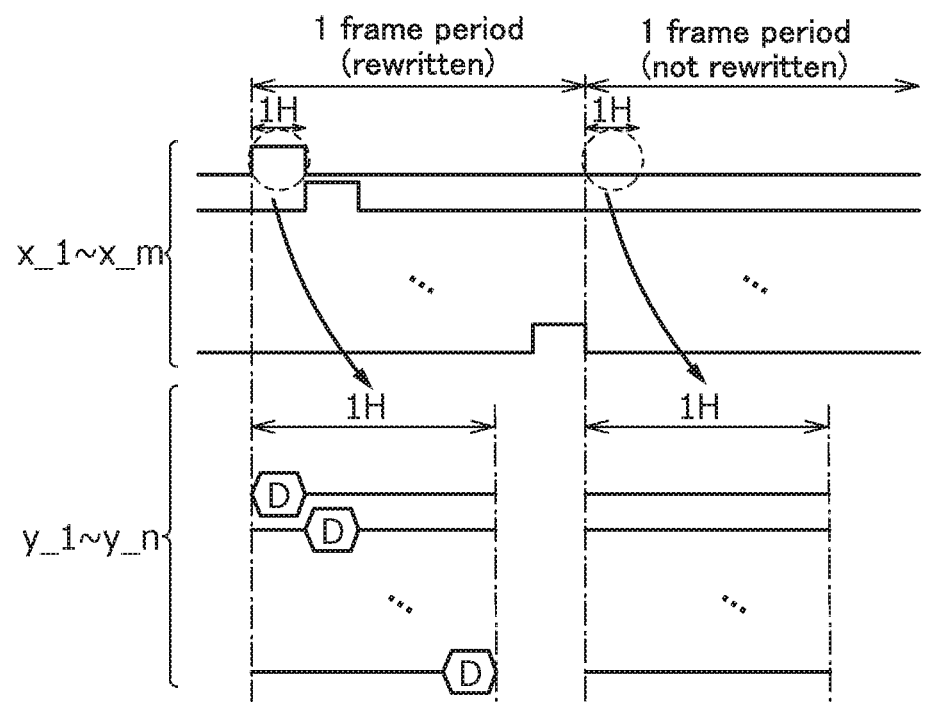

FIG. 25B is a timing chart of signals supplied to the gate lines and the source lines in the display device illustrated in FIG. 25A. The periods in FIG. 25B show the case where data signals are rewritten every frame period and the case where data signals are not rewritten. Note that periods such as a retrace period are not taken into consideration in FIG. 25B.

In the case where data signals are rewritten every frame period, scan signals are sequentially supplied to the gate lines x_1 to x_m. In a horizontal scanning period 1H, during which the scan signal is at an H level, data signals D are supplied to the source lines y_1 to y_n in the columns.

In the case where data signals are not rewritten every frame period, the supply of scan signals to the gate lines x_1 to x_m is stopped. In the horizontal scanning period 1H, the supply of data signals to the source lines y_1 to y_n in the columns is stopped.

A driving method in which data signals are not rewritten every frame period is effective particularly when an oxide semiconductor is used for a semiconductor layer where a channel of a transistor included in a pixel is formed. A transistor including an oxide semiconductor can have much lower off-state current than a transistor including a semiconductor such as silicon. Thus, a data signal written in the previous period can be held without rewriting data signals every frame period, and gray levels of pixels can be held for 1 second or longer, preferably 5 seconds or longer, for example.

In the case where polycrystalline silicon is used for a semiconductor layer where a channel of a transistor included in a pixel is formed, the capacitance of the pixel is preferably increased in advance. The larger the capacitance is, the longer the gray level of the pixel can be held. The capacitance may be determined depending on leakage current of a transistor or a display element which is electrically connected to the capacitance. For example, the capacitance per pixel is set to 5 fF to 5 pF inclusive, preferably 10 fF to 5 pF inclusive, further preferably 20 fF to 1 pF inclusive, so that a data signal written in the previous period can be held without rewriting data signals every frame period. For example, a gray level of a pixel can be held for several frame periods or several tens of frame periods.

[Examples of Driving Methods for Display Device and Touch Sensor]

Figure 26A:
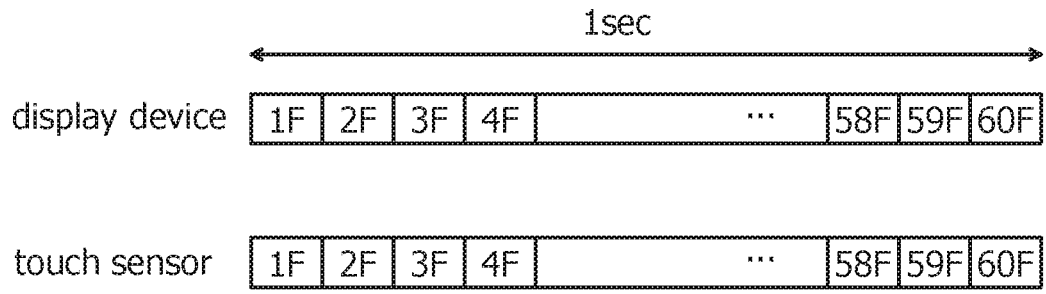
FIGS. 26A to 26D show operation of a display device and a touch sensor of an embodiment.

FIGS. 26A to 26D show examples of the operations in successive frame periods of the touch sensor described with reference to FIGS. 9A and 9B and the display device described with reference to FIGS. 25A and 25B that are driven for 1 sec (one second). In FIG. 26A, one frame period for the display device is 16.7 ms (frame frequency: 60 Hz), and one frame period for the touch sensor is 16.7 ms (frame frequency: 60 Hz).

Figure 26B:
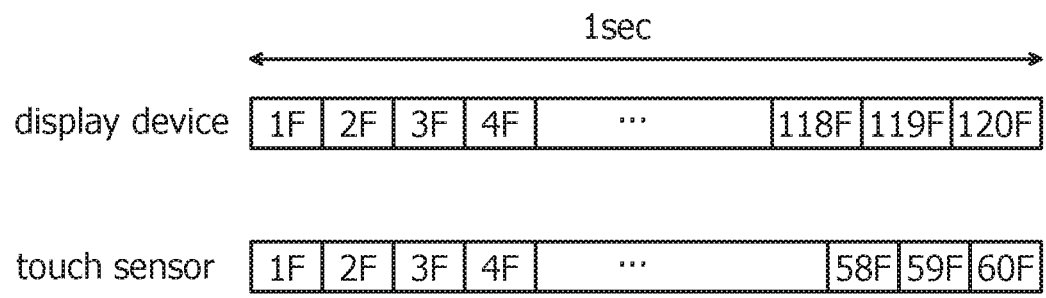

In the touch panel of this embodiment, the display device and the touch sensor operate independently of each other, and the touch sensor can have a touch sensing period concurrent with a display period. Thus, one frame period for the display device and one frame period for the touch sensor can both be 16.7 ms (frame frequency: 60 Hz) as shown in FIG. 26A. The frame frequency for the touch sensor may differ from that for the display device. For example, as shown in FIG. 26B, one frame period for the display device may be 8.3 ms (frame frequency: 120 Hz) and one frame period for the touch sensor may be 16.7 ms (frame frequency: 60 Hz). Although not shown, one frame period for the display device may be 33.3 ms (frame frequency: 30 Hz).

The frame frequency for the display device may be changeable, i.e., the frame frequency in displaying moving images may be increased (e.g., 60 Hz or more, or 120 Hz or more), whereas the frame frequency in displaying still images may be decreased (e.g., 60 Hz or less, 30 Hz or less, or 1 Hz or less). With this structure, power consumption of the display device can be reduced. The frame frequency for the touch sensor may be changeable so that the frame frequency in waiting differs from the frame frequency in sensing a touch.

The touch panel of this embodiment holds data signals rewritten in the previous period without rewriting data signals in the display device, and one frame period for the display device can thus be longer than 16.7 ms. Thus, as shown in FIG. 26C, one frame period for the display device can be 1 sec (frame frequency: 1 Hz) and one frame period for the touch sensor can be 16.7 ms (frame frequency: 60 Hz).

Figure 26C:
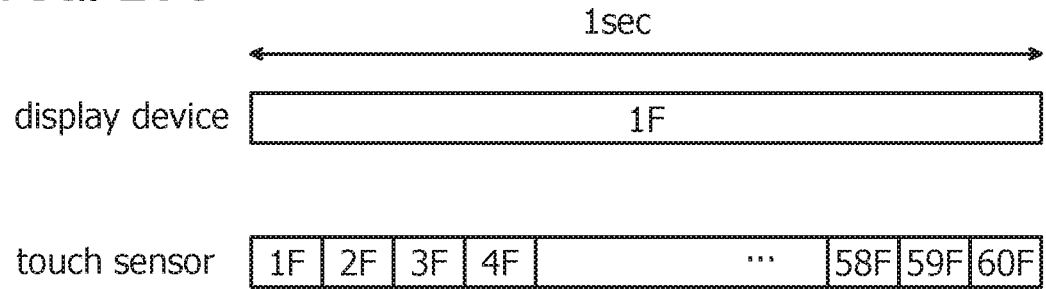
Figure 26D:
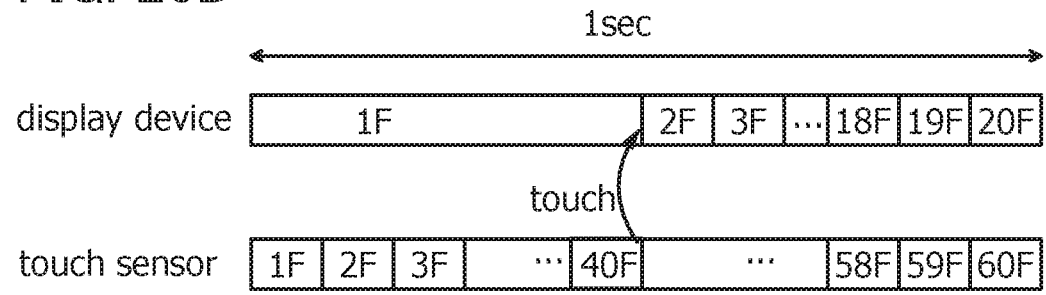

Furthermore, the touch panel of this embodiment can continue to operate the touch sensor in the driving shown in FIG. 26C. Thus, data signals in the display device can be rewritten at the timing at which the approach or contact of an object is sensed by the touch sensor, as shown in FIG. 26D.

If rewriting of data signals in a display device is performed during a sensing period of a touch sensor, noise caused by operating the display device travels through the touch sensor and the sensitivity of the touch sensor might decrease. For this reason, rewriting of data signals in a display device and sensing in a touch sensor are preferably performed in different periods.

Figure 27A:
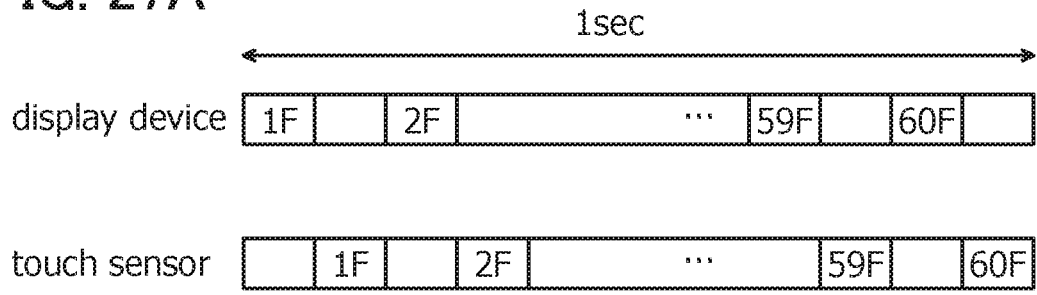
FIGS. 27A to 27D show operation of a display device and a touch sensor of an embodiment.
Figure 27B:
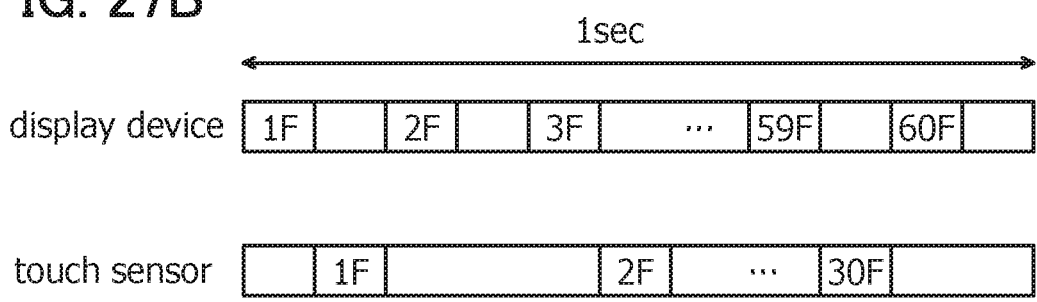

FIG. 27A shows an example in which rewriting of data signals in a display device and sensing in a touch sensor are performed alternately. FIG. 27B shows an example in which sensing in a touch sensor is performed one time every two rewritings of data signals in a display device. Note that sensing in a touch sensor may be performed once every three or more rewritings.

With the use of an oxide semiconductor for a semiconductor layer where a channel of a transistor used in a pixel of a display device is formed, off-state current can be significantly reduced and the frequency of rewriting data signals can be sufficiently reduced. Specifically, a sufficiently long break period can be set between rewritings of data signals. The break period is 0.5 seconds or longer, 1 second or longer, or 5 seconds or longer, for example. The upper limit of the break period depends on leakage current of a capacitor or a display element connected to a transistor; for example, 1 minute or shorter, 10 minutes or shorter, 1 hour or shorter, or 1 day or shorter.

Figure 27C:
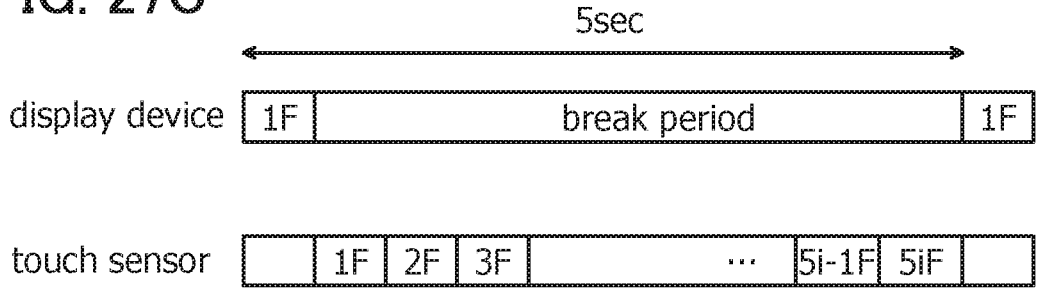
Figure 27D:
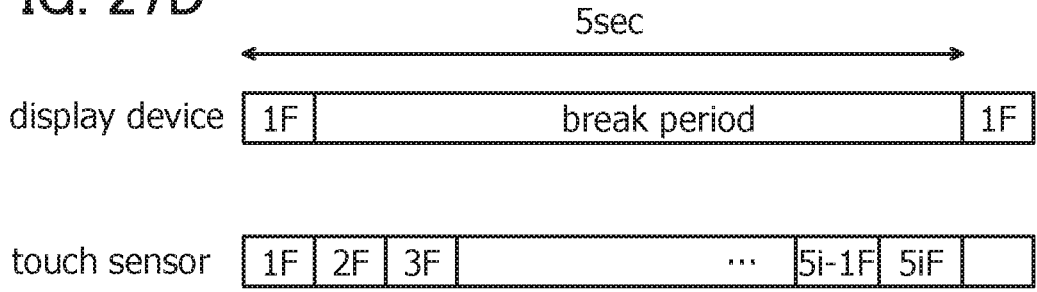

FIG. 27C shows an example in which rewriting of data signals in a display device is performed once every 5 seconds. A break period for stopping the operation of a display device is set in FIG. 27C between rewriting of data signals and next rewriting. In the break period, a touch sensor can be operated at a frame frequency of i Hz (i is more than or equal to the frame frequency of a display device; here, 0.2 Hz or more). It is preferable that sensing in a touch sensor be performed in a break period and not be performed in a rewriting period of data signals in a display device as shown in FIG. 27C, in which case sensitivity of a touch sensor can be increased. When rewriting of data signals in a display device and sensing in a touch sensor are performed at the same time as shown in FIG. 27D, operation signals can be simplified.

In a break period during which rewriting of data signals in a display device is not performed, only the supply of signals to a driver circuit may be stopped, and in addition, the supply of a power supply potential may be stopped in order to further reduce the power consumption.

The touch panel of one embodiment of the present invention includes a display device and a touch sensor between two flexible substrates. With this structure, the distance between the display device and the touch sensor can be reduced. A decrease in the sensitivity of the touch sensor caused by noise generated by driving the display device can be suppressed when the driving method in this embodiment is employed, and both a reduction in thickness and high sensitivity of a touch panel are achieved.

Embodiment 7

In this embodiment, a structure of a transistor typified by the transistor 3521 in the input/output panel of one embodiment of the present invention will be described.

The transistor 3521 may be a bottom-gate transistor, a top-gate transistor, or a transistor including two gate electrodes.

Figure 21A:
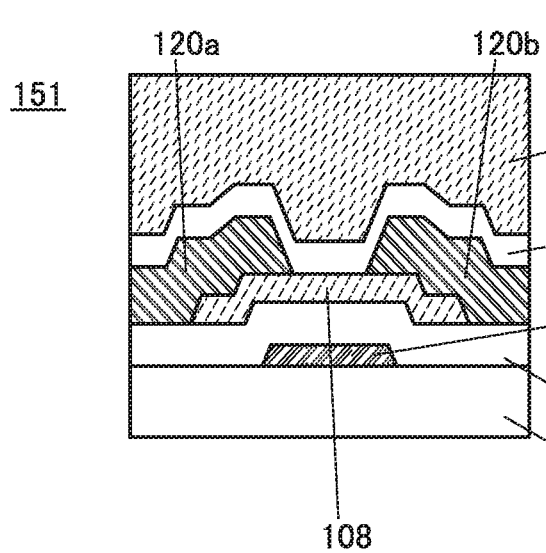
FIGS. 21A to 21D illustrate structures of transistors that can be used in an input/output panel of an embodiment.

FIG. 21A illustrates a bottom-gate transistor 151. The transistor 151 includes a conductive film 106 over a substrate 102, an insulating film 104 over the conductive film 106, a metal oxide film 108 over the insulating film 104, conductive films 120a and 120b over the metal oxide film 108, an insulating film 118 over the metal oxide film 108 and the conductive films 120a and 120b, and an insulating film 122 over the insulating film 118.

Furthermore, in the transistor 151, the conductive film 106 functions as a gate electrode, the conductive film 120a functions as a source electrode, and the conductive film 120b functions as a drain electrode.

Figure 21B:
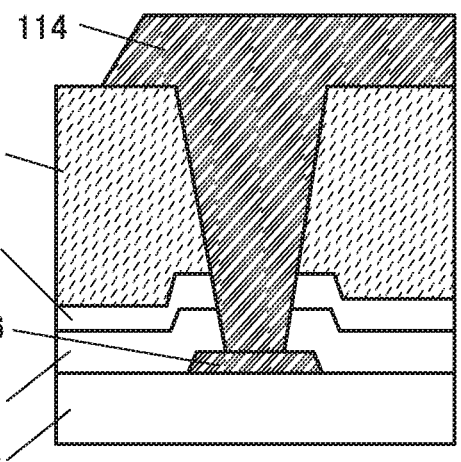

In the case where a conductive film 114 is formed over the insulating film 122 and electrically connected to the conductive film 106 serving as the gate electrode of the transistor 151, the conductive film 114 can be connected to the conductive film 106 in an opening in the insulating films 104, 118, and 122 as illustrated in FIG. 21B.

Figure 21C:
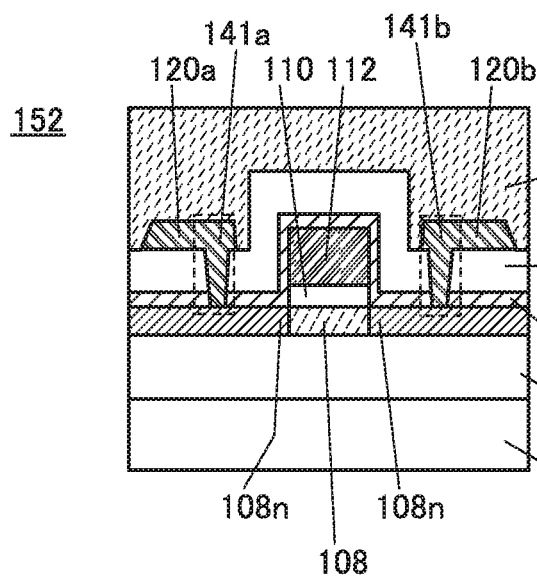

FIG. 21C illustrates a top-gate transistor 152. The transistor 152 includes the insulating film 104 over the substrate 102, the metal oxide film 108 over the insulating film 104, an insulating film 110 over the metal oxide film 108, a conductive film 112 over the insulating film 110, and an insulating film 116 over the insulating film 104, the metal oxide film 108, and the conductive film 112. The insulating film 118 is over the insulating film 116.

The metal oxide film 108 includes regions 108n which do not overlap with the conductive film 112 and are in contact with the insulating film 116. The regions 108n are n-type regions in the metal oxide film 108 described above. Note that the regions 108n are in contact with the insulating film 116 containing nitrogen or hydrogen. Nitrogen or hydrogen in the insulating film 116 is added to the regions 108n to increase the carrier density, thereby making the regions 108n n-type.

The transistor 152 includes the insulating film 118 over the insulating film 116, the conductive film 120a electrically connected to the region 108n through an opening 141a formed in the insulating films 116 and 118, and the conductive film 120b electrically connected to the region 108n through an opening 141b formed in the insulating films 116 and 118.

In the transistor 152, the conductive film 112 functions as a gate electrode, the conductive film 120a functions as a source electrode, and the conductive film 120b functions as a drain electrode.

Figure 21D:
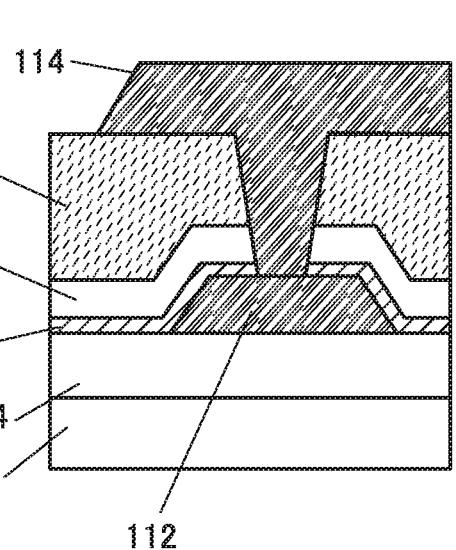

In the case where the conductive film 114 is formed over the insulating film 122 and electrically connected to the conductive film 112 serving as the gate electrode of the transistor 152, the conductive film 114 can be connected to the conductive film 112 in an opening in the insulating films 116, 118, and 122 as illustrated in FIG. 21D.

The conductive film 106 of the transistor 151 and the conductive film 112 of the transistor 152 can be used as the gate electrode 3516 of the transistor 3521 in FIGS. 1A and 1B.

The transistor including one gate electrode is described above, and a transistor 150 including two gate electrodes will be described below. The transistor 150 has a structure in which the structure of the transistor 151 and the structure of the transistor 152 are combined.

Figure 22A:
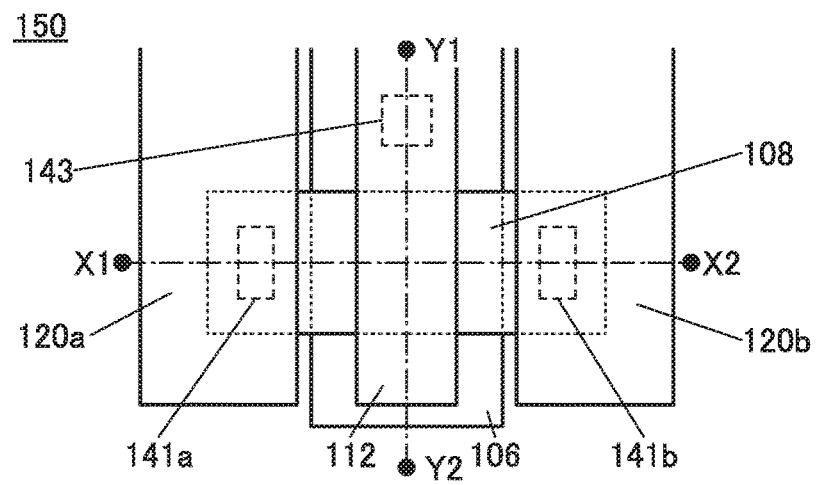
FIGS. 22A to 22C illustrate a structure of a transistor that can be used in an input/output panel of an embodiment.
Figure 22B:
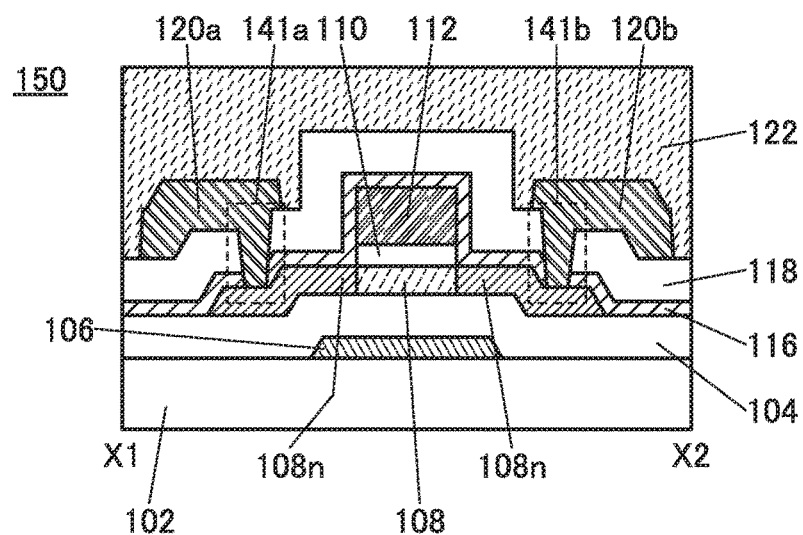
Figure 22C:
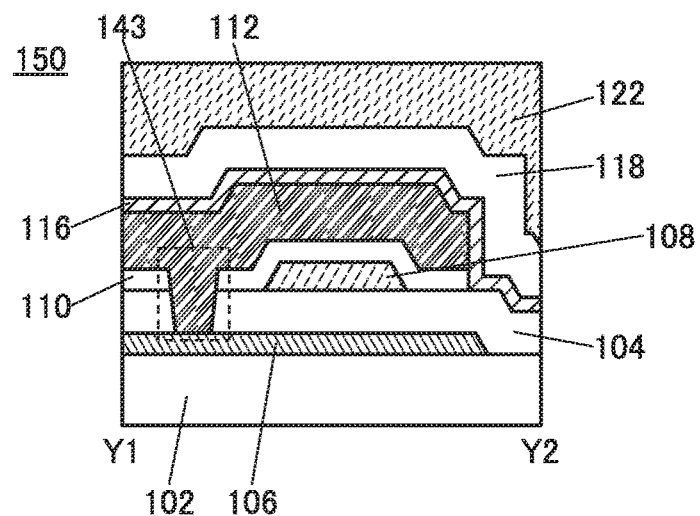

FIG. 22A is a top view of the transistor 150. FIG. 22B is a cross-sectional view taken along the dashed-dotted line X1-X2 in FIG. 22A. FIG. 22C is a cross-sectional view taken along the dashed-dotted line Y1-Y2 in FIG. 22A.

The transistor 150 illustrated in FIGS. 22A to 22C includes the conductive film 106 over the substrate 102; the insulating film 104 over the conductive film 106; the metal oxide film 108 over the insulating film 104; the insulating film 110 over the metal oxide film 108; the conductive film 112 over the insulating film 110; and the insulating film 116 over the insulating film 104, the metal oxide film 108, and the conductive film 112.

The metal oxide film 108 has a structure similar to that described in the other embodiments. The transistor 150 illustrated in FIGS. 22A to 22C includes the conductive film 106 and an opening 143.

The opening 143 is formed in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without the formation of the opening 143. Alternatively, the conductive film 106 may be used as a light-blocking film without the formation of the opening 143. When the conductive film 106 is formed using a light-blocking material, for example, light from the bottom that irradiates the metal oxide film 108 can be reduced.

In the case of the structure of the transistor 150, the conductive film 106 functions as a first gate electrode (also referred to as a bottom gate electrode), and the conductive film 112 functions as a second gate electrode (also referred to as a top gate electrode). The insulating film 104 functions as a first gate insulating film, and the insulating film 110 functions as a second gate insulating film.

The conductive film 106 can be formed using a material similar to the materials of the conductive films 112, 120a, and 120b described above. It is particularly suitable to use a material containing copper for the conductive film 106 because the resistance can be reduced. It is suitable that, for example, each of the conductive films 106, 120a, and 120b has a stacked-layer structure in which a copper film is over a titanium nitride film, a tantalum nitride film, or a tungsten film. In that case, by using the transistor 150 as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 150, but also as power source supply wirings, signal supply wirings, connection wirings, or the like of the display device.

In this manner, the transistor 150 in FIGS. 22A to 22C has a structure in which a conductive film functioning as a gate electrode is provided over and under the metal oxide film 108. As in the transistor 150, a semiconductor device of one embodiment of the present invention may have a plurality of gate electrodes.

In the case where the conductive film 114 is formed over the insulating film 122 and electrically connected to the conductive film 112 or 106 serving as the gate electrode of the transistor 150, the conductive film 114 can be connected to the conductive film 112 or 106 in an opening in the insulating films as illustrated in FIG. 21C or FIG. 21D.

As illustrated in FIGS. 22B and 22C, the metal oxide film 108 faces the conductive film 106 functioning as the first gate electrode and the conductive film 112 functioning as the second gate electrode and is positioned between the two conductive films functioning as the gate electrodes.

Furthermore, the length of the conductive film 112 in the channel width direction is larger than the length of the metal oxide film 108 in the channel width direction. In the channel width direction, the whole metal oxide film 108 is covered with the conductive film 112 with the insulating film 110 placed therebetween. Since the conductive film 112 is connected to the conductive film 106 through the opening 143 formed in the insulating films 104 and 110, a side surface of the metal oxide film 108 in the channel width direction faces the conductive film 112 with the insulating film 110 placed therebetween.

In other words, the conductive film 106 and the conductive film 112 are connected to each other through the opening 143 formed in the insulating films 104 and 110, and each include a region positioned outside an edge portion of the metal oxide film 108.

Such a structure enables the metal oxide film 108 included in the transistor 150 to be electrically surrounded by electric fields of the conductive film 106 functioning as the first gate electrode and the conductive film 112 functioning as the second gate electrode. A device structure of a transistor, like that of the transistor 150, in which electric fields of a first gate electrode and a second gate electrode electrically surround the metal oxide film 108 in which a channel region is formed can be referred to as a surrounded channel (S-channel) structure.

Since the transistor 150 has the S-channel structure, an electric field for inducing a channel can be effectively applied to the metal oxide film 108 by the conductive film 106 or the conductive film 112; thus, the current drive capability of the transistor 150 can be improved and high on-state current characteristics can be obtained. Since the on-state current can be increased, it is possible to reduce the size of the transistor 150. Furthermore, since the transistor 150 has a structure in which the metal oxide film 108 is surrounded by the conductive film 106 and the conductive film 112, the mechanical strength of the transistor 150 can be increased.

When seen in the channel width direction of the transistor 150, an opening different from the opening 143 may be formed on the side of the metal oxide film 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling a threshold voltage $V_{thA}$ of the transistor. The fixed potential $V_b$ may be the potential $V_1$ or the potential $V_2$. In that case, a potential generator circuit for generating the fixed potential $V_b$ is not necessary, which is preferable. The fixed potential $V_b$ may be different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. On the other hand, in some cases, the threshold voltage $V_{thA}$ can be low by setting the fixed potential $V_b$ high. As a result, the drain current generated when the gate-source voltage $V_{gs}$ is a high power supply potential can be increased and the operating speed of the circuit including the transistor can be improved in some cases. The fixed potential $V_b$ may be, for example, higher than the low power supply potential.

The signal B is, for example, a signal for controlling the on/off state. The signal B may be a digital signal with two kinds of potentials, a potential $V_3$ and a potential $V_4$ ($V_3 > V_4$). For example, the potential $V_3$ can be a high power supply potential, and the potential $V_4$ can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential $V_1$ and the potential $V_2$ of the signal A may be different from the potential $V_3$ and the potential $V_4$ of the signal B. For example, when a gate insulating film for the gate to which the signal B is input is thicker than a gate insulating film for the gate to which the signal A is input, the potential amplitude of the signal B ($V_3 - V_4$) may be larger than the potential amplitude of the signal A ($V_1 - V_2$). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential $V_1$ and the signal B has the potential $V_3$, or the transistor is turned off only when the signal A has the potential $V_2$ and the signal B has the potential $V_4$. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not necessarily changed as frequently as the potential of the signal A.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

An insulating film may further be formed over the transistor 150. The transistor 150 illustrated in FIGS. 22A to 22C includes the insulating film 122 over the conductive films 120a and 120b and the insulating film 118.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Note that this embodiment can be combined with any of the other embodiments in this specification as appropriate.

Embodiment 8

In this embodiment, structures of a data processor of one embodiment of the present invention will be described with reference to FIGS. 19A to 19E and FIGS. 20A to 20E.

Figure 19A:
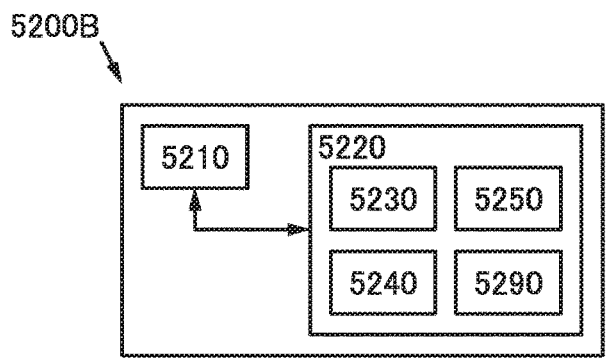
FIGS. 19A to 19E illustrate electronic devices each including an input/output panel of an embodiment.

FIGS. 19A to 19E and FIGS. 20A to 20E illustrate the structures of the data processor of one embodiment of the present invention. FIG. 19A is a block diagram of the data processor, and FIGS. 19B to 19E are perspective views illustrating the structures of the data processor. FIGS. 20A to 20E are perspective views illustrating the structures of the data processor.

<Data Processor>

A data processor 5200B described in this embodiment includes an arithmetic device 5210 and an input/output device 5220 (see FIG. 19A).

The arithmetic device 5210 has a function of receiving operation data and a function of supplying image data on the basis of the operation data.

The input/output device 5220 includes a display portion 5230, an input portion 5240, a sensor portion 5250, and a communication portion 5290 and has a function of supplying operation data and a function of receiving image data. The input/output device 5220 also has a function of supplying sensing data, a function of supplying communication data, and a function of receiving communication data.

The input portion 5240 has a function of supplying operation data. For example, the input portion 5240 supplies operation data on the basis of operation by a user of the data processor 5200B.

Specifically, a keyboard, a hardware button, a pointing device, a touch sensor, an audio input device, a sight input device, or the like can be used as the input portion 5240.

The display portion 5230 includes a display panel and has a function of displaying image data. For example, the display panel described in any of other embodiments can be used for the display portion 5230.

The sensor portion 5250 has a function of supplying sensing data. For example, the sensor portion 5250 has a function of sensing a surrounding environment where the data processor is used and supplying sensing data.

Specifically, an illuminance sensor, an imaging device, a posture determination device, a pressure sensor, a human motion sensor, or the like can be used as the sensor portion 5250.

The communication portion 5290 has a function of receiving and supplying communication data. For example, the communication portion 5290 has a function of being connected to another electronic device or a communication network by wireless communication or wired communication. Specifically, the communication portion 5290 has a function of local area wireless communication, telephone communication, or near field wireless communication, for example.

Structure Example 1 of Data Processor>

Figure 19B:
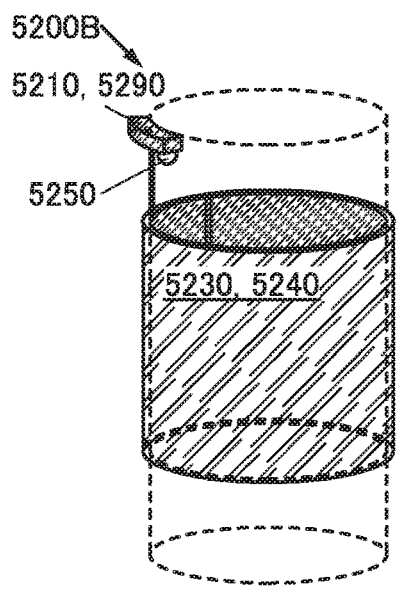

The display portion 5230 can have an outer shape along a cylindrical column, for example (see FIG. 19B). The display portion 5230 has a function of changing a display method in accordance with the illuminance of a usage environment and a function of changing displayed contents when sensing the existence of a person. Thus, the data processor 5200B can be mounted on a column of a building, for example. Alternatively, the data processor 5200B can display advertisements, information, or the like. Furthermore, the data processor 5200B can be used for digital signage or the like.

Structure Example 2 of Data Processor

Figure 19C:
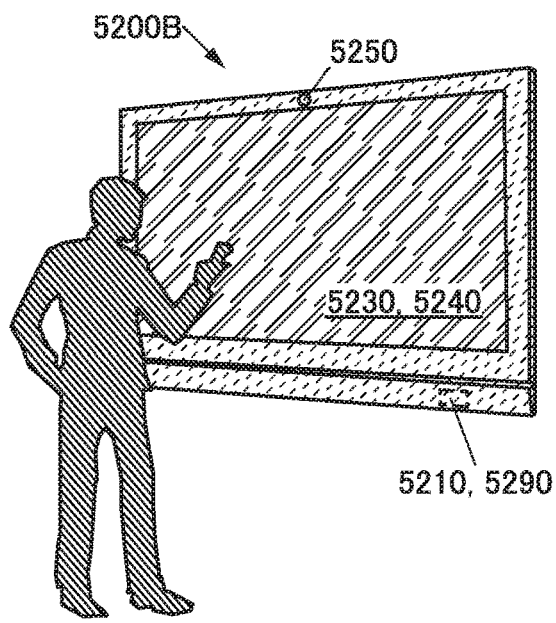

The data processor 5200B has a function of generating image data on the basis of the path of a pointer used by a user, for example (see FIG. 19C). Specifically, it is possible to use a display panel with a diagonal of 20 inches or more, preferably 40 inches or more, further preferably 55 inches or more. Alternatively, display panels can be arranged in one display region. Alternatively, display panels can be arranged to be used as a multiscreen. In this case, the data processor 5200B can be used for an electronic blackboard, an electronic bulletin board, digital signage, or the like.

Structure Example 3 of Data Processor

Figure 19D:
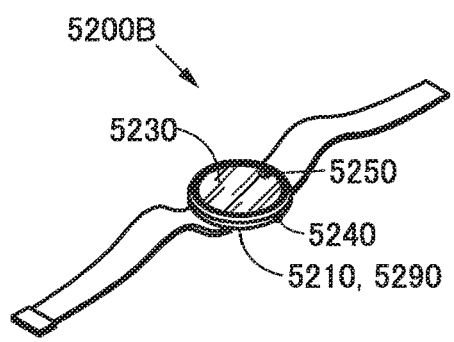

The data processor 5200B has a function of changing a display method in accordance with the illuminance of a usage environment, for example (see FIG. 19D). Thus, it is possible to obtain a smartwatch with reduced power consumption, for example. Alternatively, it is possible to obtain a smartwatch that can display an image such that the smartwatch is favorably used even in an environment with intense external light, e.g., in the open air under fine weather.

Structure Example 4 of Data Processor

Figure 19E:
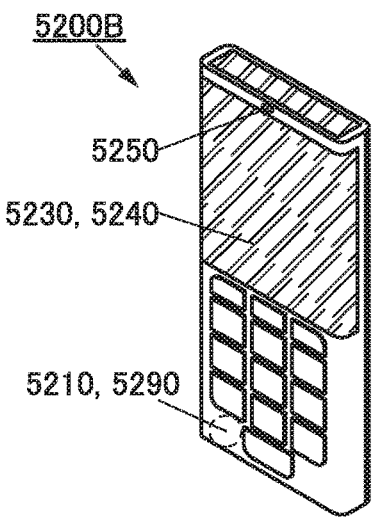

The display portion 5230 has a surface gently curved along a side surface of a housing, for example (see FIG. 19E). The display portion 5230 includes a display panel that has, for example, a function of performing display on a front surface, side surfaces, and a top surface. Thus, it is possible to obtain a mobile phone that can display image data on not only its front surface but also its side surfaces and top surface, for example.

Structure Example 5 of Data Processor

Figure 20A:
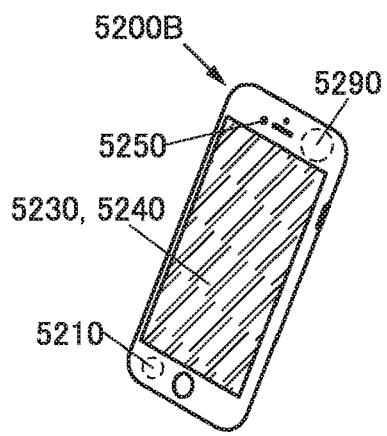
FIGS. 20A to 20E illustrate electronic devices each including an input/output panel of an embodiment.

The data processor 5200B has a function of changing a display method in accordance with the illuminance of a usage environment, for example (see FIG. 20A). Thus, it is possible to obtain a smartphone with reduced power consumption. Alternatively, it is possible to obtain a smartphone that can display an image such that the smartphone is favorably used even in an environment with intense external light, e.g., in the open air under fine weather.

Structure Example 6 of Data Processor

Figure 20B:
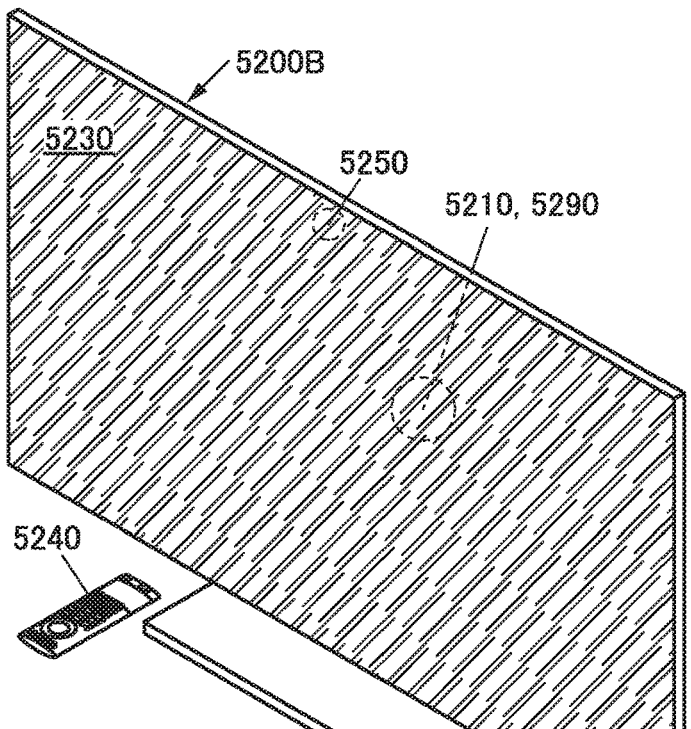

The data processor 5200B has a function of changing a display method in accordance with the illuminance of a usage environment, for example (see FIG. 20B). Thus, it is possible to obtain a television system that can display an image such that the television system is favorably used even when exposed to intense external light poured into a room in a sunny day.

Structure Example 7 of Data Processor

Figure 20C:
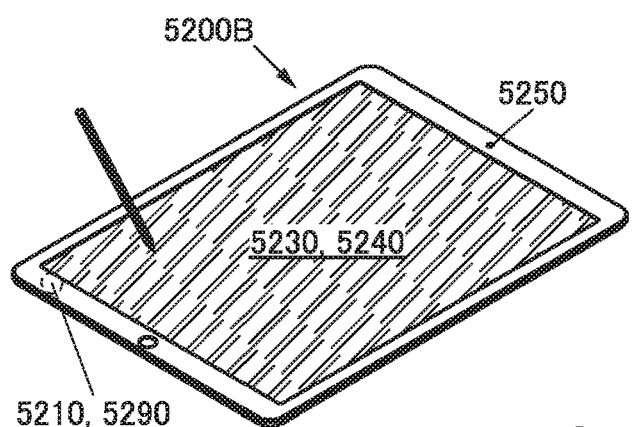

The data processor 5200B has a function of changing a display method in accordance with the illuminance of a usage environment, for example (see FIG. 20C). Thus, it is possible to obtain a tablet computer that can display an image such that the tablet computer is favorably used even in an environment with intense external light, e.g., in the open air under fine weather.

Structure Example 8 of Data Processor

Figure 20D:
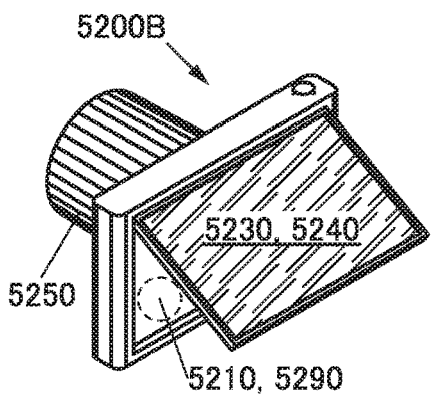

The data processor 5200B has a function of changing a display method in accordance with the illuminance of a usage environment, for example (see FIG. 20D). Thus, it is possible to obtain a digital camera that can display a subject such that an image is favorably viewed even in an environment with intense external light, e.g., in the open air under fine weather.

Structure Example 9 of Data Processor

Figure 20E:
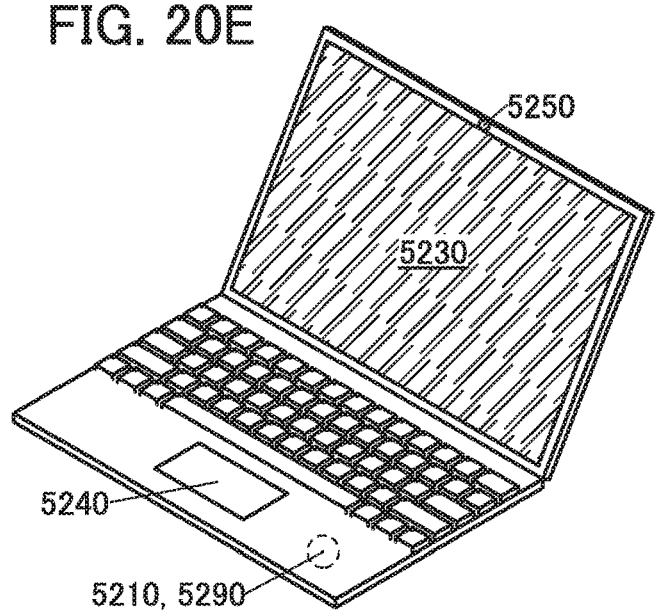

The data processor 5200B has a function of changing a display method in accordance with the illuminance of a usage environment, for example (see FIG. 20E). Thus, it is possible to obtain a personal computer that can display an image such that the personal computer is favorably used even in an environment with intense external light, e.g., in the open air under fine weather.

Note that this embodiment can be combined with any of the other embodiments in this specification as appropriate.

Embodiment 9

In this embodiment, a structure of an electronic device of one embodiment of the present invention will be described with reference to FIG. 23.
<Electronic Device>

Figure 23:
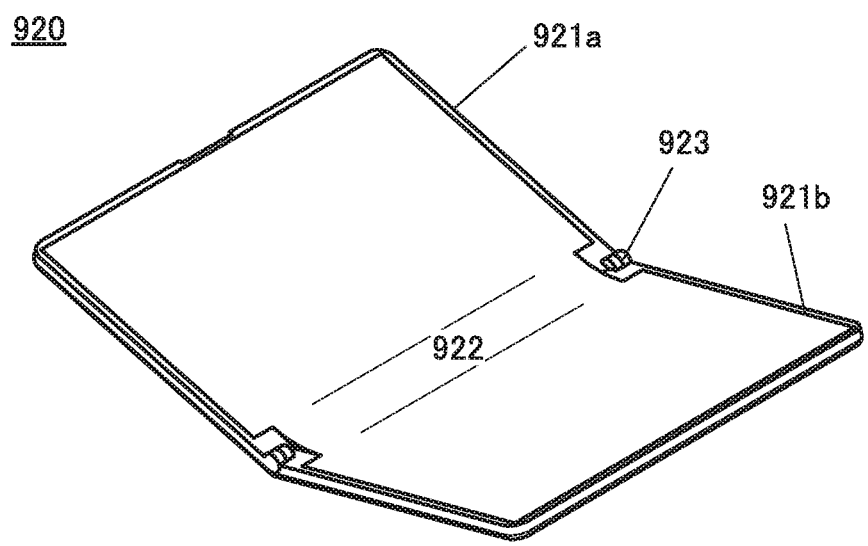
FIG. 23 illustrates an electronic device including an input/output panel of an embodiment.

FIG. 23 illustrates a foldable electronic device 920. The electronic device 920 illustrated in FIG. 23 includes a housing 921a, a housing 921b, a display portion 922, a hinge 923, and the like. The display portion 922 is incorporated in the housing 921a and the housing 921b.

The housing 921a and the housing 921b are rotatably joined to each other by the hinge 923. The electronic device 920 can be changed in shape between a state where the housing 921a and the housing 921b are closed and a state where the housing 921a and the housing 921b are opened as illustrated in FIG. 23. Thus, the electronic device 920 has high portability when carried and excellent visibility when used because of its large display region.

The hinge 923 preferably includes a locking mechanism so that an angle formed between the housing 921a and the housing 921b does not become larger than a predetermined angle when the housing 921a and the housing 921b are opened. For example, an angle at which the housing 921a and the housing 921b become locked (they are not opened any further) is preferably greater than or equal to 90° and less than 180° and is typically 90°, 120°, 135°, 150°, 175°, or the like. In that case, the convenience, the safety, and the reliability can be improved.

In the electronic device 920, the flexible display portion 922 is provided across the housing 921a and the housing 921b which are joined to each other by the hinge 923.

In the electronic device 920, the display portion 922 is greatly curved with the housing 921a and the housing 921b open. For example, the display portion 922 is held with a curvature radius of 1 mm or greater and 50 mm or less, preferably 5 mm or greater and 30 mm or less. Part of the display portion 922 can display an image while being bent since pixels are continuously arranged from the housing 921a to the housing 921b.

Since the hinge 923 includes the above-described locking mechanism, excessive force is not applied to the display portion 922; thus, breakage of the display portion 922 can be prevented. Consequently, a highly reliable electronic device can be obtained.

The display portion 922 functions as a touch panel and can be controlled with a finger, a stylus, or the like.

One of the housing 921a and the housing 921b is provided with a wireless communication module, and data can be transmitted and received through a computer network such as the Internet, a local area network (LAN), or Wi-Fi (registered trademark).

The display portion 922 is preferably formed using one flexible display. Thus, a continuous image can be displayed between the housing 921a and the housing 921b. Note that each of the housing 921a and the housing 921b may be provided with a display.

At least part of this embodiment can be implemented in combination with any of the other embodiments described in this specification as appropriate.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application Serial No. 2016-202528 filed with Japan Patent Office on Oct. 14, 2016, the entire contents of which are hereby incorporated by reference.

What is claimed is:

1. A method for driving an input/output panel comprising:
   supplying predetermined voltage to a signal line in a first period;
   supplying a selection signal to a first group of first wirings and a second group of the first wirings in a predetermined order group by group so that all the first wirings are supplied with the selection signal and sensing proximity of an object to the first group of the first wirings and the second group of the first wirings in a second period; and
   supplying a selection signal to all gate wirings in a predetermined order and supplying a video signal to the signal line in a third period,
   wherein the input/output panel comprises the gate wirings, the first wirings in the first group, the first wirings in the second group, the signal line, and a pixel,
   wherein each of the first wirings is parallel to and directly electrically connected to a corresponding one of the gate wirings,
   wherein the pixel is electrically connected to the signal line and any one of the gate wirings, and
   wherein the pixel comprises a display element.

2. The method for driving an input/output panel according to claim 1, wherein each of the first group of first wirings and the second group of first wirings comprise 3 or less first wirings.

3. The method for driving an input/output panel according to claim 1,
   wherein the third period is a display period,
   wherein the second period is a sensing period, and
   wherein a frame period comprises the display period and the sensing period.

4. The method for driving an input/output panel according to claim 3, wherein the display period and the sensing period do not overlap.

5. The method for driving an input/output panel according to claim 1, wherein the predetermined voltage supplied to the signal line in the first period is a black signal.

6. A method for driving an input/output panel comprising:
   supplying predetermined voltage to a signal line in a first period;
   supplying a selection signal to a first group of first wirings and sensing proximity of an object to the first group of the first wirings in a second period;
   supplying a selection signal to a first group of gate wirings in a predetermined order one by one so that the first group of the gate wirings is supplied with the selection signal and supplying a video signal to the signal line in a third period;
   supplying predetermined voltage to the signal line in a fourth period;
   supplying a selection signal to a second group of first wirings and sensing proximity of an object to the second group of the first wirings in a fifth period; and
   supplying a selection signal to a second group of the gate wirings in a predetermined order one by one so that the second group of the gate wirings is supplied with the selection signal and supplying a video signal to the signal line in a sixth period,
   wherein each of the first wirings is parallel to and directly electrically connected to a corresponding one of the gate wirings,
   wherein the input/output panel comprises a first display region and a second display region adjacent to the first display region,
   wherein the first display region comprises the first group of the gate wirings and the signal line, and
   wherein the second display region comprises the second group of the gate wirings and the signal line.

7. The method for driving an input/output panel according to claim 6, wherein each of the first group of the first wirings and the second group of the first wirings comprise 3 or less first wirings.

8. The method for driving an input/output panel according to claim 6,
   wherein the third period is a display period,
   wherein the second period is a sensing period, and
   wherein a frame period comprises the display period and the sensing period.

9. The method for driving an input/output panel according to claim 6, wherein the predetermined voltage supplied to the signal line in the first period is a black signal.

* * * * *